(12) United States Patent
Ohsawa et al.

(10) Patent No.: US 7,852,696 B2
(45) Date of Patent: Dec. 14, 2010

(54) SEMICONDUCTOR MEMORY DEVICE AND DRIVING METHOD THEREOF

(75) Inventors: Takashi Ohsawa, Yokohama (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 12/243,195

(22) Filed: Oct. 1, 2008

(65) Prior Publication Data
US 2009/0086559 A1 Apr. 2, 2009

(30) Foreign Application Priority Data
Oct. 2, 2007 (JP) ............................ 2007-258974

(51) Int. Cl.
*G11C 7/00* (2006.01)
(52) U.S. Cl. ...................... 365/222; 365/207
(58) Field of Classification Search ................. 365/222, 365/207, 230.06, 149
See application file for complete search history.

(56) References Cited

U.S. PATENT DOCUMENTS

| 6,687,152 | B2 | 2/2004 | Ohsawa |
| 6,982,918 | B2 | 1/2006 | Fazan et al. |
| 7,170,807 | B2 | 1/2007 | Fazan et al. |
| 7,440,353 | B2 * | 10/2008 | Kim et al. ..................... 365/222 |
| 7,596,038 | B2 * | 9/2009 | Kim et al. .............. 365/189.09 |
| 7,619,944 | B2 * | 11/2009 | Fisch et al. .................. 365/222 |
| 2005/0128851 | A1 * | 6/2005 | Fazan et al. .................. 365/222 |

OTHER PUBLICATIONS

U.S. Appl. No. 12/352,876, filed Jan. 13, 2009, Higashi, et al.
Pierre Fazan et al, "A New Block Refresh Concept for SOI Floating Body Memories", IEEE, 2003, pp. 15-16.

* cited by examiner

*Primary Examiner*—Anh Phung
(74) *Attorney, Agent, or Firm*—Oblon, Spivak, McClelland, Maier & Neustadt, L.L.P.

(57) ABSTRACT

This disclosure concerns a memory including a memory cell including a drain, a source and a floating body, wherein when a refresh operation is executed, a first current is carried from the drain or the source to the body and a second current is carried from the body to the second gate electrode by applying a first voltage and a second voltage to the first gate electrode and the second gate electrode, the first voltage and the second voltage being opposite in polarity to each other, and a state of the memory cell is covered to an stationary state in which an amount of the electric charges based on the first current flowing in one cycle of the refresh operation is almost equal to an amount of the electric charges based on the second current flowing in one cycle of the refresh operation.

16 Claims, 14 Drawing Sheets

FIRST EMBODIMENT

SECOND EMBODIMENT

FOURTH EMBODIMENT

SIXTH EMBODIMENT

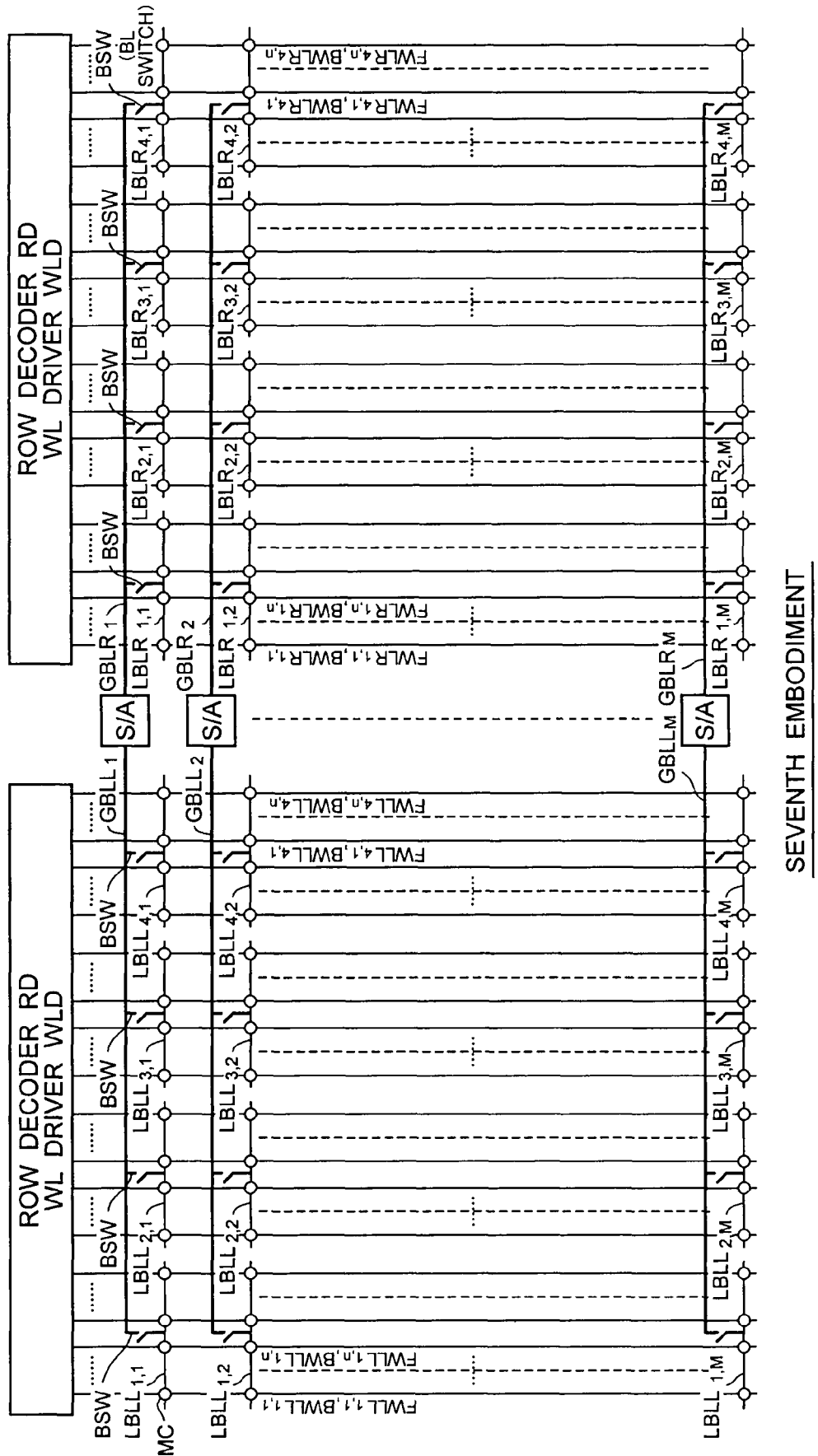
FIG.17 SEVENTH EMBODIMENT

SEMICONDUCTOR MEMORY DEVICE AND DRIVING METHOD THEREOF

CROSS-REFERENCE TO RELATED APPLICATIONS

This application is based upon and claims the benefit of priority from the prior Japanese Patent Application No. 2007-258974, filed on Oct. 2, 2007, the entire contents of which are incorporated herein by reference.

BACKGROUND OF THE INVENTION

1. Field of the Invention

The present invention relates to a semiconductor memory device and a driving method of a semiconductor memory device, and more particularly relates to, for example, an FBC (Floating Body Cell) memory device storing information by accumulating majority carriers in a floating body of each field effect transistor.

2. Related Art

In recent years, there has been known an FBC memory device as a semiconductor memory device expected as a memory replacing a 1T (Transistor)-1C (Capacitor) DRAM. The FBC memory device has FETs (Field Effect Transistors) each including a floating body (hereinafter, also "body"), formed on an SOI (Silicon On Insulator) substrate, stores data "1" or data "0" in each FET according to the number of majority carriers accumulated in the body of the FET. It is assumed, for example, that a state of an FBC constituted by an N-FET in which the number of holes accumulated in the body of the FBC is large is data "1" and a state thereof in which the number of holes accumulated in the body of the FBC is small is data "1".

The FBC is superior to the conventional DRAM in that the FBC is smaller in size. However, the body of the FBC accumulating electric charges is lower in electrostatic capacity than a capacitor of the conventional DRAM. Due to this, although leakage current from the body of the FBC is lower than that from the capacitor of the conventional DRAM, the FBC is shorter in data holding time than the DRAM. This requires the FBC to frequently perform a refresh operation. As a result, a ratio of time in which ordinary data read/write operations are prohibited (refresh busy rate) becomes disadvantageously high. Further, the FBC is disadvantageously higher in current necessary for data holding than the conventional DRAM. The high current consumption is a serious problem particularly for a portable device.

Moreover, it is necessary to increase a size of a current driving driver of the FBC memory device since data is written to each memory cell by applying current to the memory cell. Due to this, the entire FBC memory device is not so small in size (chip size) despite small-sized memory cells. That is, a ratio of the memory cells to the entire chip (cell efficiency) is low.

To deal with the problems, the block refresh method has been proposed (see P. Fazan, S. Okhonin and M. Nagoga, "A new block refresh concept for SOI floating body memories" IEEE Int. SOI Conference, pp. 15-16, September, 2003, U.S. Pat. No. 6,982,918 Specification, and U.S. Pat. No. 7,170,807 Specification). The block refresh is a method of supplying holes to "1" cells by impact ionization and then pulling out holes from both "0" cells and "1" cells using charge pumping phenomenon. The charge pumping phenomenon is a phenomenon that holes are pulled out from the body as a result of recombination of electrons trapped to a surface state present on an interface between a silicon substrate and a gate dielectric film and holes in the body. The surface state normally has a density of about $10^{10}$ cm$^{-2}$. Accordingly, about one surface state is present for a channel having an area, for example, 0.1 μm×0.1 μm on an average. That is, it is quite a high probability that memory cells without surface states are present. The block refresh method is not, therefore, ineffective and impractical for the memory cells without surface states.

SUMMARY OF THE INVENTION

A semiconductor memory device according to an embodiment of the present invention comprises a semiconductor layer; a source layer and a drain layer provided in the semiconductor layer; a body region provided on the semiconductor layer between the source layer and the drain layer, and accumulating electric charges or emitting the electric charges to store logic data; a first gate dielectric film provided on a first surface of the body region; a first gate electrode provide on the first surface of the body region via the first gate dielectric film; a second gate dielectric film provided on a second surface of the body region, the second surface different from the first surface; a second gate electrode provide on the second surface of the body region via the second gate dielectric film; a driver driving the first gate electrode or the second gate electrode; and a sense amplifier sensing the logic data from a memory cell including the source layer, the drain layer, and the body region, wherein when a refresh operation for returning deteriorated logic data of the memory cell to original logic data is periodically executed, a first current is carried from the drain layer or the source layer to the body region and a second current is carried from the body region to the second gate electrode by respectively applying a first voltage and a second voltage to the first gate electrode and the second gate electrode, the first voltage and the second voltage being opposite in polarity to each other with respect to a potential of the source layer set as a reference potential, and a state of the memory cell is changed to an stationary state in which an amount of the electric charges based on the first current flowing in one cycle of the refresh operation is almost equal to an amount of the electric charges based on the second current flowing in one cycle of the refresh operation.

A semiconductor memory device according to an embodiment of the present invention comprises a semiconductor layer; a source layer and a drain layer provided in the semiconductor layer; a body region provided on the semiconductor layer between the source layer and the drain layer, and accumulating electric charges or emitting the electric charges to store logic data; a first gate dielectric film provided on a first surface of the body region; a first gate electrode provide on the first surface of the body region via the first gate dielectric film; a second gate dielectric film provided on a second surface of the body region, the second surface different from the first surface; a second gate electrode provide on the second surface of the body region via the second gate dielectric film; a driver driving the first gate electrode and the second gate electrode; and a sense amplifier sensing the logic data from a memory cell including the source layer, the drain layer, and the body region, wherein a potential of the second gate electrode is fixed to a certain potential so as to constantly carry a tunnel current from the body region to the second gate electrode, and when a refresh operation for returning deteriorated logic data of the memory cell to original logic data is periodically executed, a first current is carried from the drain layer or the source layer to the body region by applying a first voltage to the first gate electrode, the first voltage being opposite in polarity to the potential of the second gate electrode with respect to a potential of the source layer set as a reference potential, and when the refresh operation is periodically executed, a state of the memory cell is changed to an stationary state in which an amount of the electric charges based on the first current flowing into the body region in one cycle of the refresh operation is almost equal to an amount of the electric charges based on the second current flowing into the second gate electrode from the body region in one cycle of the refresh operation.

A method of driving a semiconductor memory device according to an embodiment of the present invention, the semiconductor memory device comprising a semiconductor layer; a source layer and a drain layer provided in the semiconductor layer; a body region provided on the semiconductor layer between the source layer and the drain layer, and accumulating electric charges or emitting the electric charges to store logic data; a first gate dielectric film provided on a first surface of the body region; a first gate electrode provide on the first surface of the body region via the first gate dielectric film; a second gate dielectric film provided on a second surface of the body region, the second surface different from the first surface; a second gate electrode provide on the second surface of the body region via the second gate dielectric film; a driver driving the first gate electrode and the second gate electrode; and a sense amplifier sensing the logic data from a memory cell including the source layer, the drain layer, and the body region, wherein the method comprises carrying an impact ionization current from the drain layer or the source layer to the body region and a tunnel current from the body region to the second gate electrode by respectively applying a first and a second voltages to the first gate electrode and the second gate electrode, the first voltage and the second voltage being opposite in polarity to each other with respect to a potential of the source layer set as a reference potential, and making an amount of the electric charges based a the first current flowing into the body region in one cycle of the refresh operation almost equal to an amount of the electric charges based on a second current flowing out of the body region in one cycle of the refresh operation, when a refresh operation for returning deteriorated logic data of the memory cell to original logic data is periodically executed.

A method of driving a semiconductor memory device according to an embodiment of the present invention, the semiconductor memory device comprising a semiconductor layer; a source layer and a drain layer provided in the semiconductor layer; a body region provided on the semiconductor layer between the source layer and the drain layer, and accumulating electric charges or emitting the electric charges to store logic data; a first gate dielectric film provided on a first surface of the body region; a first gate electrode provide on the first surface of the body region via the first gate dielectric film; a second gate dielectric film provided on a second surface of the body region, the second surface different from the first surface; a second gate electrode provide on the second surface of the body region via the second gate dielectric film; a driver driving the first gate electrode and the second gate electrode; and a sense amplifier sensing the logic data from a memory cell including the source layer, the drain layer, and the body region or writing the logic data to the memory cell, wherein the method comprises fixing a potential of the second gate electrode to a certain potential so as to constantly carry a tunnel current from the body region to the second gate electrode;

carrying an impact ionization current from the drain layer or the source layer to the body region by changing a potential of the first gate electrode to a potential opposite in polarity to the potential of the second gate electrode with respect to a potential of the source layer set as a reference potential, when a refresh operation for returning deteriorated logic data of the memory cell to original logic data is periodically executed; and making an amount of the electric charges based on the first current flowing into the body region in one cycle of the refresh operation almost equal to an amount of the electric charges based on the second current flowing out of the body region in one cycle of the refresh operation if the refresh operation is periodically executed.

BRIEF DESCRIPTION OF THE DRAWINGS

FIG. 17 is a schematic diagram showing an example of a configuration of an FBC memory device according to a seventh embodiment of the present invention.

DETAILED DESCRIPTION OF THE INVENTION

Embodiments of the present invention will be explained below in detail with reference to the accompanying drawings. Note that the invention is not limited thereto.

First Embodiment

Figure 1:
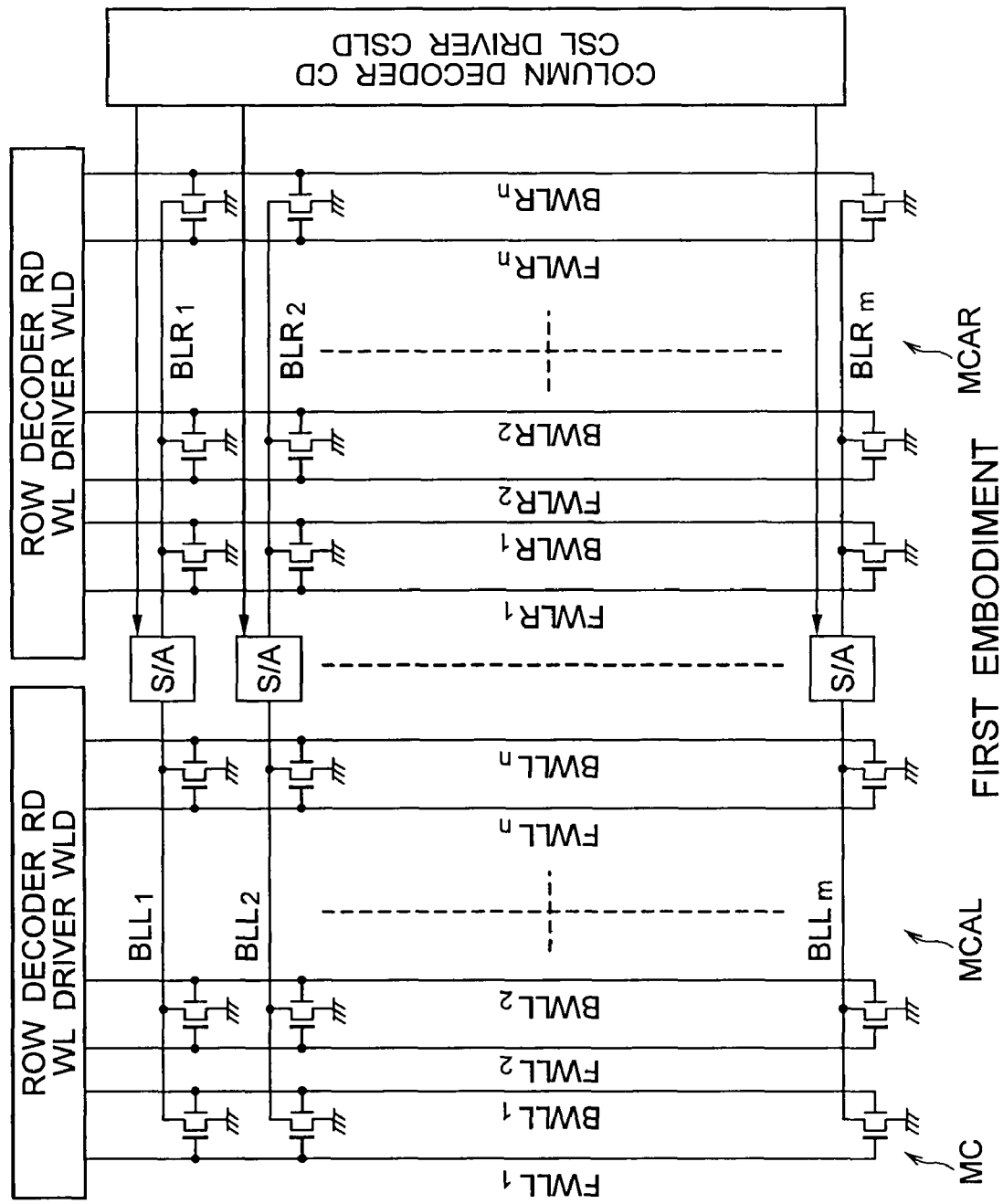
FIG. 1 is a schematic diagram showing an example of a configuration of an FBC memory device according to a first embodiment of the present invention.

FIG. 1 is a schematic diagram showing an example of a configuration of an FBC memory device according to a first embodiment of the present invention. The FBC memory device includes memory cells MCs, front word lines FWLL0 to FWLLn and FWLR0 to FWLRn (hereinafter, also "FWLs"), back word lines BWLLs and BWLRs (hereinafter, also "BWLs"), bit lines BLL0 to BLLm and BLR0 to BLRm (hereinafter, also "BLs"), sense amplifiers S/As, row decoders RDs, WL (word line) drivers WLDs, a column decoder CD, and a CSL driver CSLD.

The memory cells MCs are arranged two-dimensionally in a matrix and constitute memory cell arrays MCAL and MCAR (hereinafter, also "MCAs"). The front word lines FWLs extend in a row direction and also function as a front gate (first gate electrode) of each memory cell MC. The number of the front word lines FWLs is (n+1) on each of the left and right of the sense amplifiers S/As. Similarly to the front word lines FWLs, the back word lines BWLs extend in the row direction and also function as a back gate (second gate electrode) of each memory cell MC. The number of the back word lines BWLs is (n+1) on each of left and right of the sense amplifiers S/As. Each of the bit lines BLs extends in a column direction and is connected to a source or a drain of each memory cell MC. The number of bit lines BLs is (m+1) on each of the left and right of the sense amplifiers S/As. The front word lines FWLs are orthogonal to the bit lines BLs and the memory cells MCs are provided at crosspoints between the front word lines FWLs and the bit lines BLs, respectively. The memory cells MCs of this type are referred to as "crosspoint" memory cells MCs. The row direction and the column direction can be replaced with each other.

In a data read/write operation, one of paired bit lines BLL and BLR connected to both sides of one sense amplifier S/A, respectively transmits data stored in the memory cells MCs connected to the bit line BLL or BLR and the other applies a reference current Iref. The reference current Iref is a current almost intermediate between a current carried to "0" cells and a current carried to "1" cells. Although dummy cells, dummy word lines, averaging circuits, a dummy cell write circuit, and the like are necessary to provide so as to generate the reference current Iref, they are not shown in FIG. 1. The sense amplifier S/A applies a current to the memory cells MCs via one of the bit lines BLs connected to the sense amplifier S/A. A current according to data stored in the memory cells MCs is thereby carried to sense nodes in the sense amplifier S/A. The sense amplifier S/A discriminates whether a logic value of data is "1" or "0" depending on whether the current carried to the sense nodes is higher or lower than the reference current Iref. This operation method is referred to as "1 cell/bit (single cell) method".

Alternatively, in the data read/write operation, one data on one of the paired bit lines BLL and BLR connected to the both sides of one sense amplifier S/A, respectively can be set as reference data of the other data and the other data on the other bit line BLR or BLL can be set as reference data of one data. In this case, it is necessary that the two selected memory cells MCs connected to the paired bit lines BLL and BLR store complementary data (data "1" and data "0"), respectively. That is, since the two memory cells store one bit as a whole, this operation method is referred to as "two-cell/bit (twin-cell) method". The first embodiment is applicable to both a single-cell method and the twin-cell method. The first embodiment is also applicable to other methods.

Each of the row decoders RDs decodes a row address to select a specific front word line FWL among a plurality of front word lines FWLs. The WL driver WLD corresponding to each row decoder RD applies a voltage to the selected front word line FWL, thereby activating this front word line FWL. Furthermore, each of the row decoders RDs decodes a row address to select a specific back word line BWL among a plurality of back word lines BWLs. The WL driver WLD corresponding to each row decoder RD applies a voltage to the selected back word line BWL, thereby activating this back word line BWL.

The column decoder CD decodes a column address to select a specific column among a plurality of columns. The CSL driver CSLD applies a potential to a column selection line CSL, thereby reading data from the corresponding sense amplifier S/A to a DQ buffer (not shown). If a ground potential or a source potential is set as a reference potential, a polarity of a voltage indicates a voltage in a positive direction or a negative direction from the reference potential. A polarity of data indicates complementary data "1" or data "0".

Figure 2:
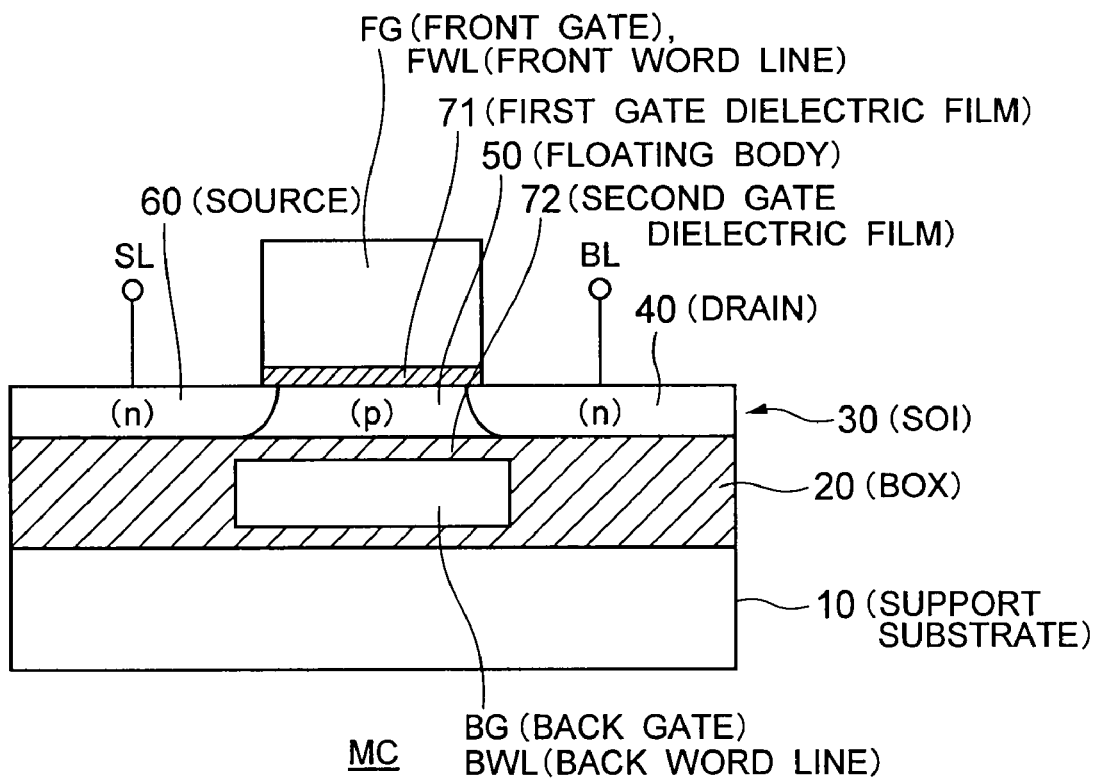
FIG. 2 is a cross-sectional view showing an example of a structure of each of the memory cells MCs.

FIG. 2 is a cross-sectional view showing an example of a structure of each of the memory cells MCs. The memory cell MC is provided on an SOI substrate including a support substrate 10, a BOX layer 20, and an SOI layer 30. A source 60 and a drain 40 are provided in the SOI layer 30. A floating body 50 is formed on the SOI layer 30 between the source 60 and the drain 40. The body 50 is a semiconductor opposite in conduction to the source 60 and the drain 40. In the first embodiment, the memory cell MC is an N-FET. The body 50 is in an electrically floating state since a part of or all of the body 50 is surrounded by the source 60, the drain 40, the BOX layer 20, a first gate dielectric film 71, a second gate dielectric film 72, and an STI (Shallow Trench Isolation) (not shown). The FBC memory device can store logic data (binary data) in each memory cell MC according to the number of majority carriers accumulated in the body 50 of the memory cell MC.

The first gate dielectric film 71 is provided on an upper surface of the body 50 and the second gate dielectric film 72 is provided on a bottom surface of the body 50 opposite to the upper surface thereof. One front word line (first gate electrode) FWL is provided on the upper surface of the body 50 via the first gate dielectric film 71. One back word line (second gate electrode) BWL is provided on the bottom surface of the body 50 via the second gate dielectric film 72. In the first embodiment, the back word line BWL is provided to be buried in the BOX layer 20. A thickness of the second gate dielectric film 72 is equal to or smaller than that of the first gate dielectric film 71. The thickness of the second gate dielectric film 72 is set to such a thickness as to carry a direct tunnel current between the body 50 and the back word line BWL. The thickness of the second gate dielectric film 72 is, for example, equal to or smaller than 3 nm. If the second gate dielectric film 72 is equal in thickness to the first gate dielectric film 71, the first and second gate dielectric films 71 and 72 can be simultaneously formed in a Fin-FBC to be described later (see FIGS. 9 and 10). Accordingly, by setting the thickness of the second gate dielectric film 72 equal to that of the first gate dielectric film 71, it is advantageously possible to facilitate a Fin-FBC memory device.

An example of a method of writing data to one memory cell MC will be described. To write data "1" to one memory cell MC, the memory cell MC is caused to operate in a saturation state. For example, a voltage of the front word line FWL is biased to 1.5 V and that of the bit line BL is biased to 1.5 V. A voltage of the source 60 of the memory cell MC is set to a ground GND (0 V). A voltage of the back word line BWL is fixed to, for example, −0.5 V. By so setting, impact ionization occurs near the drain 40 and a large quantity of electron-hole pairs are generated. The electrons generated by the impact ionization flow into the drain 40 and the holes generated by the impact ionization are accumulated in the body 50 lower in potential. When a current carried at the time of generation of the holes by the impact ionization is equal to a forward current at a pn junction between the body 50 and the source 60, a voltage of the body 50 (body voltage) turns into a stationary state. The body voltage in the stationary state is about 0.7 V.

To write data "0" to one memory cell MC, the potential of the bit line BL is reduced to negative voltage. For example, the potential of the bit line BL is reduced to −1.5 V. By this operation, a pn junction between the body 50 and the drain 40 is biased greatly in forward direction. The holes accumulated in the body 50 are emitted to the drain 40 and data "0" is stored in the memory cell MC.

An example of a method of reading data from one memory cell MC will be described. In a data read operation, the front word line FWL is activated similarly to a data write operation but the voltage of the bit line BL is set lower than that of the bit line BL when data "1" is written to the memory cell MC. For example, the voltage of the front word line FWL is set to 1.5 V and that of the bit line BL is set to 0.2 V. By so setting, the memory cell MC is caused to operate in a linear region. The potential of the back word line BWL is fixed to, for example, −0.5 V. A "0" cell and a "1" cell differ in a threshold voltage of the memory cell MC according to the difference in the number of holes accumulated in the body 50. By detecting the difference in threshold voltage, it is discriminated whether data is "1" or "0". The reason for setting the voltage of the bit line BL to the low voltage during the data read operation is as follows. If the voltage of the bit line BL is set to high voltage to bias the memory cell MC to the saturation state, the "0" cell is possibly changed to the "1" cell by the impact ionization if the data "0" is read.

The refresh operation means an operation for returning deteriorated data of the "1" cell or "0" cell to an original state. More specifically, the refresh operation is an operation for supplementing holes into each "1" cell and pulling out holes from each "0" cell. The refresh operation enables the signal difference between the data "1" and the data "0" to be returned to the signal difference almost equivalent to that during the data write operation.

In the conventional refresh operation, the sense amplifier S/A temporarily reads data from the memory cells MCs and writes back data identical in logic to the read data to the memory cells MCs. However, in the refresh operation according to the first embodiment, the sense amplifier S/A does not reads data from the memory cells MCs. In the refresh operation according to the first embodiment, an appropriate front word line potential VFWL, an appropriate back word line potential VBWL, and an appropriate bit line potential VBL are applied equally to the "0" cells and the "1" cells without reading data from the "0" and "1" cells, thereby simultaneously and autonomously refreshing the "0" and "1" cells using the body potential difference between the "0" and "1" cells. The refresh operation of this type is referred to as "autonomous refresh operation". Conditions for the front word line potential VFWL, the back word line potential VBWL, and the bit line potential VBL will be described later.

Figure 3:
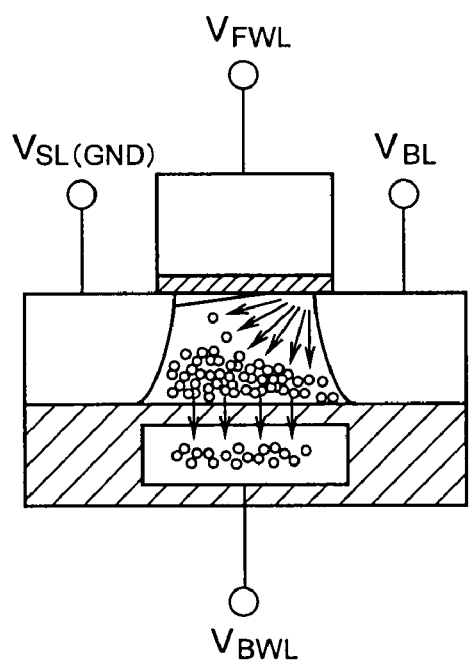
FIG. 3 is a conceptual diagram showing the autonomous refresh operation according to the first embodiment.

FIG. 3 is a conceptual diagram showing the autonomous refresh operation according to the first embodiment. In the first embodiment, the voltages of the front word line FWL and that of the back word line BWL are controlled independently of each other. By controlling the voltage of the front word line FWL, the impact ionization occurs to a front-side channel. Impact ionization current is carried from the drain 40 to the body 50, thereby accumulating holes in the body 50. At the same time, the voltage of the back word line BWL is controlled, thereby carrying tunnel current from the body 50 to the back word line BWL. By carrying the tunnel current from the body 50 to the back word line BWL, the holes accumulated in the body 50 are emitted to the back word line BWL. Outflow of the tunnel current from the body 50 can be rephrased by injection of electrons from the back word line BWL to the body 50.

Figure 5:
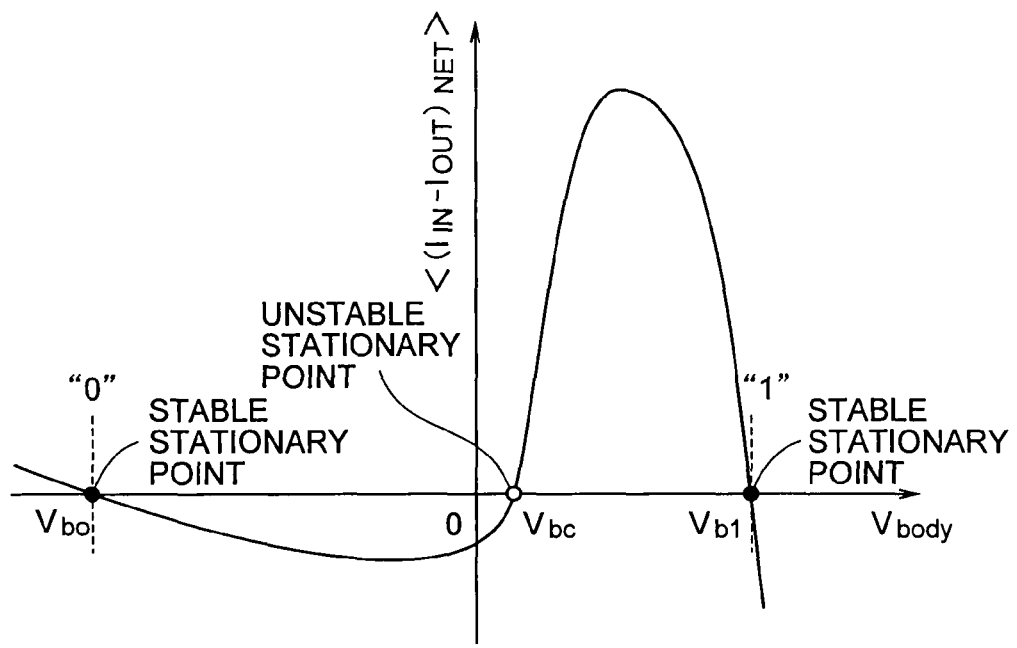
FIG. 5 is a graph showing the relationship between the body potential and the body current of the FBC memory device according to the first embodiment.

As shown in FIG. 5, each of the impact ionization current and the tunnel current has two stable stationary states on both sides of one unstable stationary point. By simultaneously applying the impact ionization current and the tunnel current to all the memory cells MCs, each of the memory cells MCs converges into one of the two stable stationary states. Accordingly, if one of the states is set to data "1" and the other is set to data "0", all the memory cells MCs can be autonomously refreshed by simultaneously applying the impact ionization current and the tunnel current to the memory cells MCs as long as data deteriorations in the "0" cells and the "1" cells do not exceed the unstable stationary point.

Figure 4:
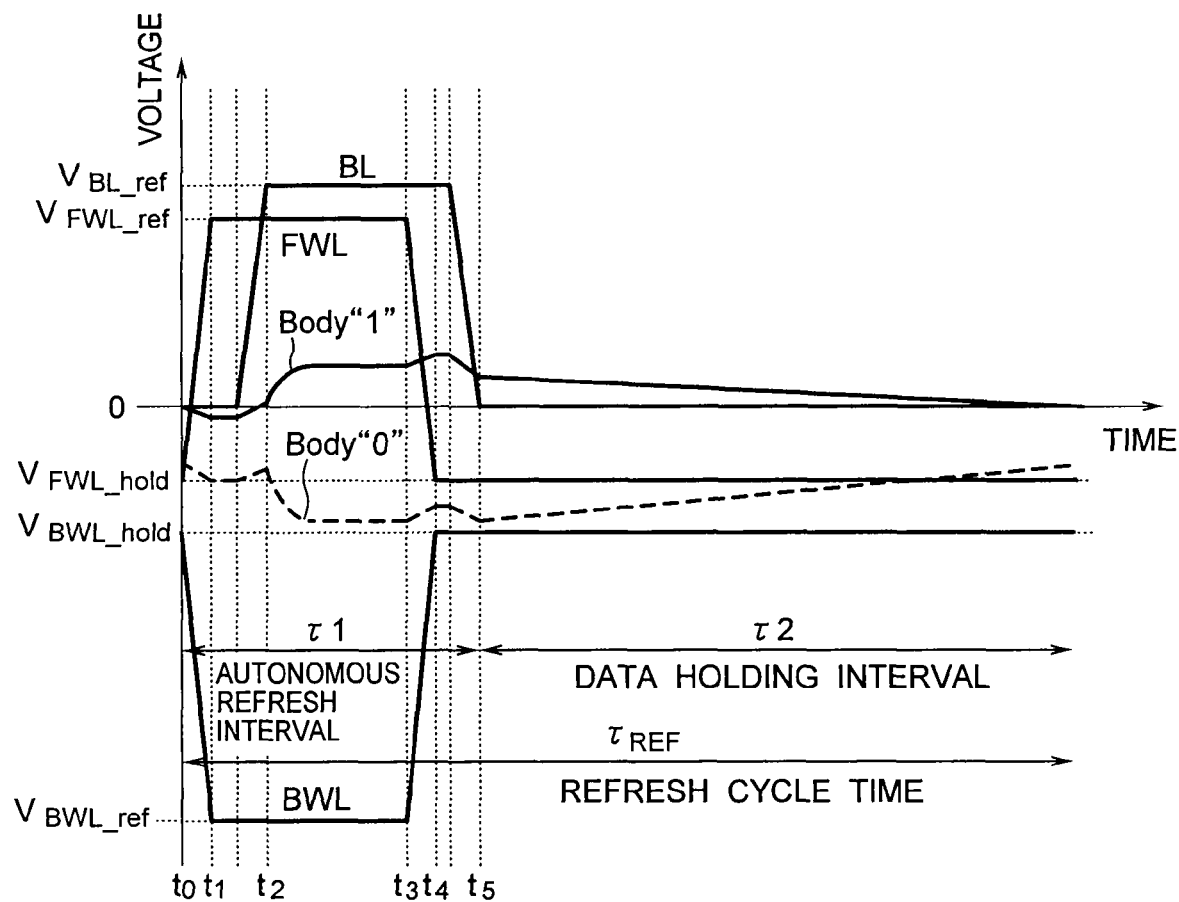
FIG. 4 is a timing diagram showing the autonomous refresh operation (hereinafter, also simply "refresh or refreshing") according to the first embodiment.

FIG. 4 is a timing diagram showing the autonomous refresh operation (hereinafter, also simply "refresh or refreshing") according to the first embodiment. In FIG. 4, a horizontal axis indicates time and a vertical axis indicates voltage. FIG. 4 shows the front word line FWL, the back word line BWL, the bit line BL, and body potentials Body1 and Body0. The body1 refers to the body potential of the "1" cell and the body0 refers to the body potential of the "0" cell. Further, FIG. 4 shows the autonomous refresh operation in a data holding mode (standby state) in which an operation for writing data from outside or an operation for reading data to the outside is not executed. The potential of a source line is fixed to, for example, the ground potential GND (0 V).

In the data holding mode, there is no access from the outside. However, the signal difference between the "1" cell and the "0" cell gradually decreases (deteriorates) by leakage current at pn junctions and current caused by GIDL (Gate Induced Leakage) or the like. It is, therefore, necessary to periodically execute the refresh operation even in the data holding mode. That is, the data holding mode can be divided into a data holding period (data holding state) and a refresh period (refresh operation). A time interval from start of one refresh operation to start of a next refresh operation will be referred to as "refresh interval (refresh operation cycle)" or "one cycle".

At time t0, the FBC memory device changes from the data holding state to the refresh operation. At time t1, the potential of the front word line FWL is raised from a data holding level VFWL_hold to a high level potential VFWL_ref higher than the potential (ground potential) of the source line SL. At the same time, the potential of the back word line BWL is dropped from a data holding level VBWL_hold to a low level potential VBWL_ref lower than the potential (ground potential) of the source line SL. That is, voltages opposite in polarity relative to the source potential are applied to the front word line FWL and the back word line BWL, respectively.

At time t2, the potential of the bit line BL is raised from a data holding level (the ground potential equal to the potential of the source line SL) to a high level potential VBL_ref equal in polarity to the potential of the front word line FWL. Since the potentials of both the front word line FWL and the bit line BL are set to the high level potentials, a channel on the upper surface of the body 50 of the memory cell MC turns into a saturation region and impact ionization occurs near the drain 40. A large quantity of electron-hole pairs are generated by the impact ionizations. The electrons generated by the impact ionization flow into the drain 40 and the holes generated by the impact ionization are accumulated in the body 50 lower in potential.

On the other hand, since the voltage VBWL_ref of the back word line BWL is far lower than the body potential, a high electric field is applied to the second gate dielectric film 72 shown in FIG. 2. This electric field causes gate direct tunneling, thereby injecting electrons from the back word line BWL into the body 50. The electrons recombine with the holes in the body 50, thereby eliminating (emitting) holes in the body 50. That is, the gate direct tunneling causes the tunnel current to flow from the body 50 to the back word line BWL.

FIG. 5 is a graph showing the relationship between the body potential and the body current of the FBC memory device according to the first embodiment. The body current is a difference between total current Iin flowing into the body 50 and total current Iout flowing out from the body 50. In the first embodiment, the body current is defined as "<(Iin–Iout)$_{NET}$>.

In FIG. 5, a curve indicates that the body current is in a stationary state at body currents Vb0, Vbc, and Vb1. If the body current Vbody is lower than Vb0, the body potential Vbody rises and becomes closer to Vb0 because of Iin>Iout. If the body potential Vbody is between Vb0 and Vbc, the body potential Vbody falls and becomes closer to Vb0 because of Iin<Iout. If the body potential Vbody is between Vbc and Vb1, the body potential Vbody rises and becomes closer to Vb1 because of Iin>Iout. If the body potential Vbody is higher than Vb1, the body potential Vbody falls and becomes closer to Vb1 because of Iin<Iout. In this way, the body current autonomously adjusts the number of holes in the body 50 so that the body potential Vbody converges into either Vb0 or Vb1. Therefore, Vb0 and Vb1 are referred to as "stable stationary points" of the body potential Vbody.

On the other hand, if the body potential Vbody deviates from Vbc, the body potential Vbody moves to Vb0 or Vb1. Therefore, Vbc is an unstable stationary point.

For example, the body potential Vbody of the "0" cell is Vb0 and that of the "1" cell is Vb1. In this case, unless the "0" cell and the "1" cell are greatly deteriorated to exceed the unstable stationary point Vbc, even if the body potential Vbody of the "0" cell and that of the "1" cell deviates from Vb0 and Vb1, the body potentials Vbody of the "0" and "1" cells can be returned to Vb0 and Vb1, respectively. That is, if data of the "0" cells and the "1" cells are deteriorated, both the "0" cells and the "1" cells can be simultaneously and autonomously refreshed by applying the impact ionization current and the tunnel current to the memory cells MCs. At this time, there is no need to change voltages of the front word lines FWLs and the back word lines BWLs according to the rows, respectively but the voltages of the front word lines FWLs and the back word lines BWLs can be set to the same potentials (VFWL_ref and VBWL_ref), respectively in all rows. Besides, there is no need to change voltages of the bit lines BLs according to the columns but the voltages of the bit lines BLs can be set to the same potential (VBL_ref) in all columns.

The autonomous refreshing according to the first embodiment can simultaneously and autonomously refresh both the "0" cells and the "1" cells in a state in which the voltage of the front word lines FWLs are set almost equal to one another in all the rows and the voltage of the bit lines BLs are set almost equal to one another in all the columns. As a result, there is no need to read data to the sense amplifiers S/As and a plurality of memory cells connected to the same bit line BL can be simultaneously refreshed. That is, the autonomous refreshing can be simultaneously and collectively performed on all the memory cells MCs in a memory cell array.

The body current will be described. The body current can be represented by the following Equation (1).

$$<(Iin-Iout)_{NET}> = <(Iin1-Iout1)_{NET}> + <(Iin2-Iout2)_{NET}> \quad (1)$$

In the Equation (1), <(Iin–Iout)$_{NET}$> indicates a time average of the difference between the total current Iin flowing into the body 50 and the total current Iout flowing out of the body 50. In the data holding state, one cycle τREF can be divided into an autonomous refresh interval τ1 and a data holding interval τ2 as shown in FIG. 4. In the autonomous refresh interval τ1, the difference between the total current Iin flowing into the body 50 and the total current Iout flowing out of the body 50 is denoted by <(Iin1–Iout1)$_{NET}$>. In the data holding interval τ2, the difference between the total current Iin flowing into the body 50 and the total current Iout flowing out of the body 50 is denoted by <(Iin2–Iout2)$_{NET}$>.

The difference <(Iin1–Iout1)$_{NET}$> is a value obtained by averaging the current flowing in or out of the body 50 mainly by the impact ionization and the gate direct tunneling over the entire autonomous refresh interval τ1. The difference <(Iin1–Iout1)$_{NET}$> can be represented by the following Equation (2).

$$<(Iin1-Iout1)_{NET}> = (Iii1+IGIDL1+IPN1+Idt1+ICP) \times \tau1/\tau REF \quad (2)$$

In the Equation (2), Iii1 denotes a hole current generated by the impact ionization (impact ionization current). IGIDL1 denotes a hole current caused by the GIDL. IPN1 denotes a current flowing through the pn junction between the body 50 and the source 60 or the body 50 and the drain 40. Idt1 denotes a direct tunneling current (tunnel current) flowing through the second gate dielectric film 72. ICP denotes a current (charge pumping current) caused by the charge pumping phenomenon that occurs when the voltage of the front word line FWL is dropped. The charge pumping phenomenon is the phenomenon that holes are pulled out from the body 50 as a result of recombination of electrons trapped to a surface state present on an interface between the body 50 and the first gate dielectric film 71 and holes in the body. The charge pumping current is generated in a period from t3 to t4 in FIG. 4. τ1/τREF denotes a ratio of the autonomous refresh interval in one cycle.

In the Equation (2), "+" (plus) means that holes (current) flow (flows) into the body 50 and "–" (minus) means that holes (current) flow (flows) out of the body 50. Accordingly, the impact ionization current Iii1 is a positive value and the tunnel current Idt1, and the charge pumping current ICP are negative values. The IGIDL1 is a positive value. The IPN1 could be a positive or negative value according to the potentials of the drain 40, the body 50, and the source 60, respectively. For example, if the body potential Vbody is lower than the source potential and the drain potential, it is considered that the IPN1 is a positive value; otherwise, it is considered that the IPN1 is a negative value. Further, if current flowing in or out of the body 50 is present, the current can be added into parentheses on a left side of the Equation (2). A total average of these currents in the autonomous refresh interval τ1 is <(Iin1–Iout1)$_{NET}$>. In the autonomous refresh interval τ1, the impact ionization current Iii1 and the tunnel current Idt1 are high and act as main components of the body current Vbody.

<(Iin2–Iout2)$_{NET}$> is a value obtained by averaging the current flowing into and out of the body 50 by the impact ionization and the gate direct tunneling in the data holding interval c2 over the entire data holding interval τ2. <(Iin2–Iout2)$_{NET}$> can be represented by the following Equation (3).

$$<(Iin2-Iout2)_{NET}> = (Iii2+IGIDL2+IPN2+Idt2) \times \tau2/\tau REF \quad (3)$$

In the data holding interval $\tau 2$, the potentials of the word lines FWL and BWL are kept to constant values, so that no charge pumping current ICP flows. In the Equation (3), Iii2 denotes impact ionization current in the data holding interval $\tau 2$. IGIDL2 denotes a hole current caused by the GIDL in the data holding interval $\tau 2$. Idt2 denotes a tunnel current in the data holding interval $\tau 2$. $\tau 2/\tau REF$ denotes a ratio of the data holding interval in one cycle.

The impact ionization current Iii2 and the tunnel current Idt2 in the data holding interval $\tau 2$ are actually far lower than the impact ionization current Iii1 and the tunnel current Idt1 in the data holding interval $\tau 1$, respectively. Further, IGIDL1, IPN1, ICP, IGIDL2, and IPN2 are far lower than the impact ionization current Iii1 and the tunnel current Idt1 in the data holding interval $\tau 1$. Iii2, Idt2, and IGIDL2 are almost zero. It can be, therefore, said that the main components of the body current in the data holding mode are the impact ionization current Iii1 and the tunnel current Idt1. That is, $<(Iin-Iout)_{NET}>$ in the Equation (1) is almost determined by the impact ionization current Iii1 and the tunnel current Idt1.

Node potentials of the front word line FWL, the back word line BWL, and the bit line BL differ between the autonomous refresh interval $\tau 1$ and the data holding interval $\tau 2$. Therefore, if the interval changes from the autonomous refresh interval $\tau 1$ changes to the data holding interval $\tau 2$ or from the data holding interval $\tau 2$ to the autonomous refresh interval $\tau 1$ by capacitive coupling of the node of each of the front word line FWL, the back word line BWL, and the bit word line BL and the body 50, the body potential Vbody often shifts. A shift amount of the body potential Vbody at this time is denoted by $\Delta$Vbody. The shift amount $\Delta$Vbody results from the capacitive coupling between each of the nodes and the body 50. Accordingly, if the interval changes from the autonomous refresh interval $\tau 1$ changes to the data holding interval $\tau 2$ or from the data holding interval $\tau 2$ to the autonomous refresh interval $\tau 1$, it is necessary to shift the body potential Vbody by $\Delta$Vbody.

Therefore, to obtain the curve shown in FIG. 5, it is necessary to shift one of a curve representing the relationship between the body current $<(Iin-Iout)_{NET}>$ and the body voltage Vbody in the autonomous refresh interval $\tau 1$ and a curve representing the relationship between the body current $<(Iin-Iout)_{NET}>$ and the body voltage Vbody in the data holding interval $\tau 2$ by $\Delta$Vbody and then to add up the curves. For example, if the body potential Vbody changes by $\Delta$Vbody (positive value) when the interval changes from the autonomous refresh interval $\tau 1$ to the data holding interval $\tau 2$, the curve representing the relationship between the body current $<(Iin-Iout)_{NET}>$ and the body voltage Vbody in the data holding interval $\tau 2$ is translated by $-\Delta$Vbody, the resultant curve is added to the curve the relationship between the body current $<(Iin-Iout)_{NET}>$ and the body voltage Vbody in the autonomous refresh interval c1, thereby obtaining the curve shown in FIG. 5. That is, $<(Iin-Iout)_{NET}>$ in the Equation (1) is the sum of $<(Iin1-Iout1)_{NET}>$ and $<(Iin2-Iin2)_{NET}>$ obtained by translating Vbody by $-\Delta$Vbody. The horizontal axis shown in FIG. 4 at this time indicates the body potential Vbody in the autonomous refresh interval $\tau 1$. Needless to say, the curve in the autonomous refresh interval $\tau 1$ can be translated by $+\Delta$Vbody while fixing the curve in the data holding interval $\tau 2$. Note that the curve shown in FIG. 5 indicates $<(Iin-Iout)_{NET}>$ shown in the Equation (5).

As shown in FIG. 5, $<(Iin-Iout)_{NET}>$ is zero at the three different body potentials Vb0, Vbc, and Vb1. The body potentials Vb0, Vbc, and Vb1 correspond to the stationary points since the amount of current flowing in (the number of holes accumulated in) the body 50 is almost equal to the amount of current flowing out of (the number of holes emitted from) the body 50. However, as already described, the Vbc is an unstable stationary point for the following reason. If the body potential Vbody deviates from the Vbc by an infinitesimal potential due to the influence of nose or the like, the deviation is amplified and the body potential Vbody, therefore, changes in a direction away from the Vbc. Conversely, the Vb0 and Vb1 are stable stationary points for the following reason. Even if the body potential Vbody deviates from the Vb0 or Vb1, the body potential Vbody converges into the Vb0 or Vb1 as long as the body potential Vbody does not exceed the Vbc. That is, the stable stationary points Vb0 and Vb1 can be used to indicate polarities (0 or 1) of data and the unstable stationary point Vbc can be used as a boundary point between the data "0" and the data "1".

If the stable stationary points Vb0 and Vb1 are used as the data "0" and the data "1", respectively, the data "0" and the data "1" can be returned to the stable stationary points Vb0 and Vb1 by simultaneously applying the front word line voltage VFWL_ref, the back word line voltage VBWL_ref, and the bit line voltage VBL equally to all the memory cells MCs. That is, all the memory cells MCs in the memory cell array can be autonomously refreshed. However, if the "0" cells and the "1" cells are greatly deteriorated and the body potential Vbody exceeds the unstable stationary point Vbc, the polarities of the data stored in the memory cells MCs are inverted. It is, therefore, necessary to perform the autonomous refresh operation on the "1" cells and the "0" cells before the body potential Vbody of each of the "1" cells and the "0" cells exceeds the unstable stationary point Vbc.

The FBC memory device according to the first embodiment can autonomously recover the data states of the respective memory cells MCs by the autonomous refreshing. Therefore, there is no need to perform the conventional refresh operation for causing each sense amplifier S/A to read data stored in the memory cells MCs and to restore this data to the original memory cells MCs, respectively. Sine the sense amplifiers S/A do not need to read data, a plurality of memory cells MCs connected to the bit line BL in a certain column can be simultaneously refreshed. Furthermore, the autonomous refreshing enable both the "0" cells and the "1" cells to be refreshed simultaneously in the state in which the voltages of the front word lines FWLs are set almost equal in all of the rows, the voltages of the back word lines BWLs are set almost equal in all of the rows, and the voltages of the bit lines BLs are set almost equal in all of the columns.

The autonomous refreshing according to the first embodiment can considerably increase the number of memory cells MCs that can be refreshed simultaneously as compared with the conventional refreshing. Due to this, current necessary to charge the bit lines BLs can be greatly reduced and the refresh busy rate can be greatly reduced (see FIG. 15). Moreover, as shown in FIGS. 16 and 17, the number of sense amplifiers S/As can be decreased and the chip size can be, therefore, reduced. That is, the FBC memory device according to the first embodiment is low in the refresh busy rate, is low in current consumption in the data holding interval, and can be made small in size.

In the first embodiment, the autonomous refresh operation can be executed even if function (operation) of the front word lines FWLs is replaced by function (operation) of the back word lines BWLs.

In the first embodiment the autonomous refreshing can be simultaneously executed on the entire memory cell array. However, the number of front word lines FWLs, the number of back word lines BWLs, and the number of bit lines BLs to be activated simultaneously can be restricted. That is, the memory cell array can be refreshed partially (according to blocks). The memory cell array is a unit of a plurality of memory cells MCs obtained by dividing the memory cell arrays MCs arranged in a matrix into a plurality of parts.

Second Embodiment

Figure 6:
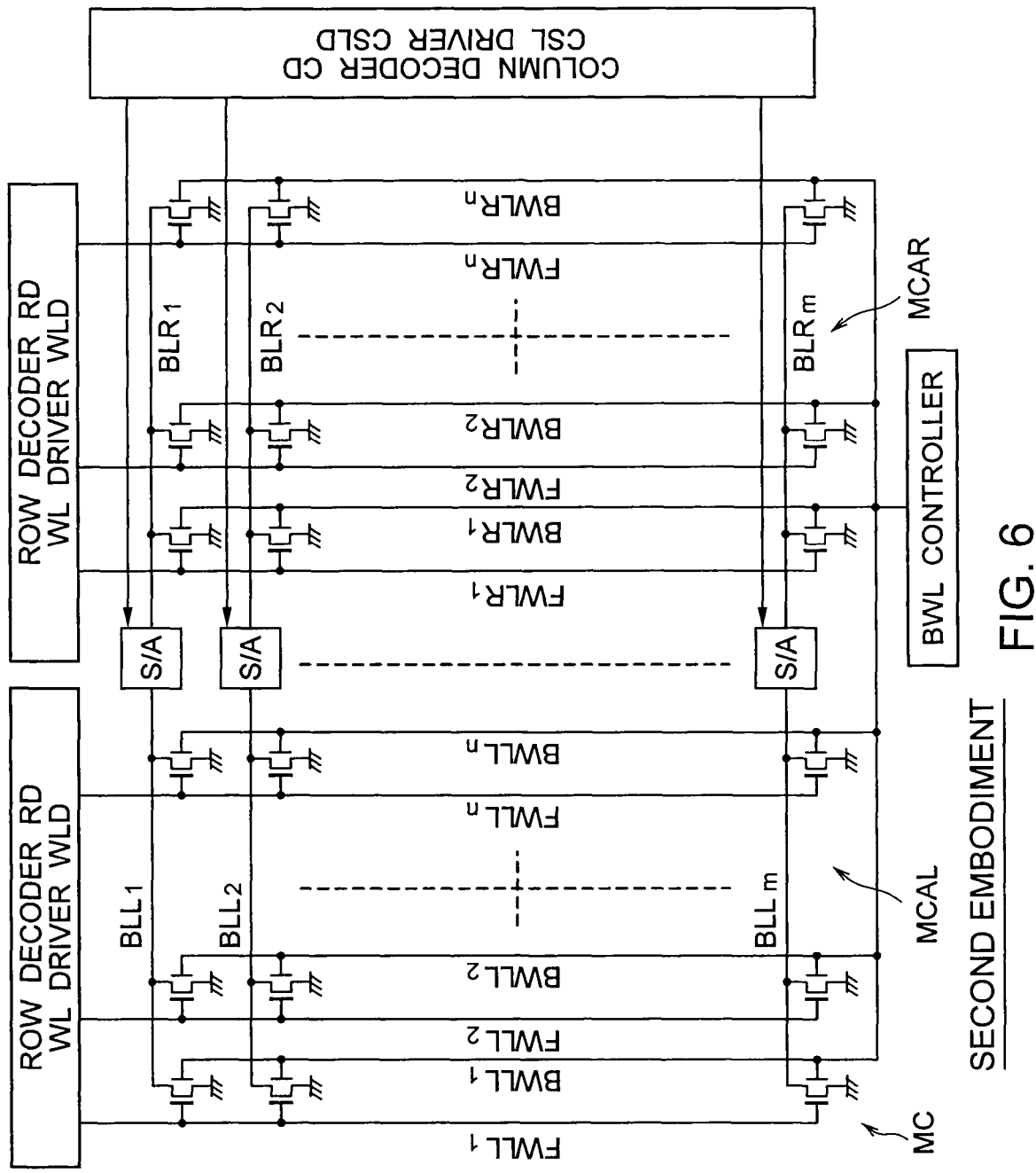
FIG. 6 is a schematic diagram showing an example of a configuration of an FBC memory device according to a second embodiment of the present invention.

FIG. 6 is a schematic diagram showing an example of a configuration of an FBC memory device according to a second embodiment of the present invention. The second embodiment differs from the first embodiment in that the back word lines BWLs are shared between the memory cell arrays MCAL and MCAR. A BWL controller according to the second embodiment collectively controls the back word lines BWLs in the memory cells MCAL and MCAR. Other configurations of the FBC memory device according to the second embodiment can be similar to those according to the first embodiment. The back word lines BWLs can be shared by each of the memory cell arrays MCAL and MCAR. By doing so, the FBC memory device according to the second embodiment can simultaneously and autonomously refresh the entire memory cell array MCAL or MCAR similarly to the first embodiment. The second embodiment can exhibit the same advantages as those of the first embodiment. Furthermore, according to the second embodiment, since it suffices to control the back word lines BWLs for each of the memory cell arrays MCAL and MCAR, the BWL controller can be simplified. Although, according to the second embodiment, the memory cell array MCAL or MCAR cannot be partially autonomously refreshed, it can be done so if the back word line sharing unit is limited to the partial refresh unit.

Figure 7:
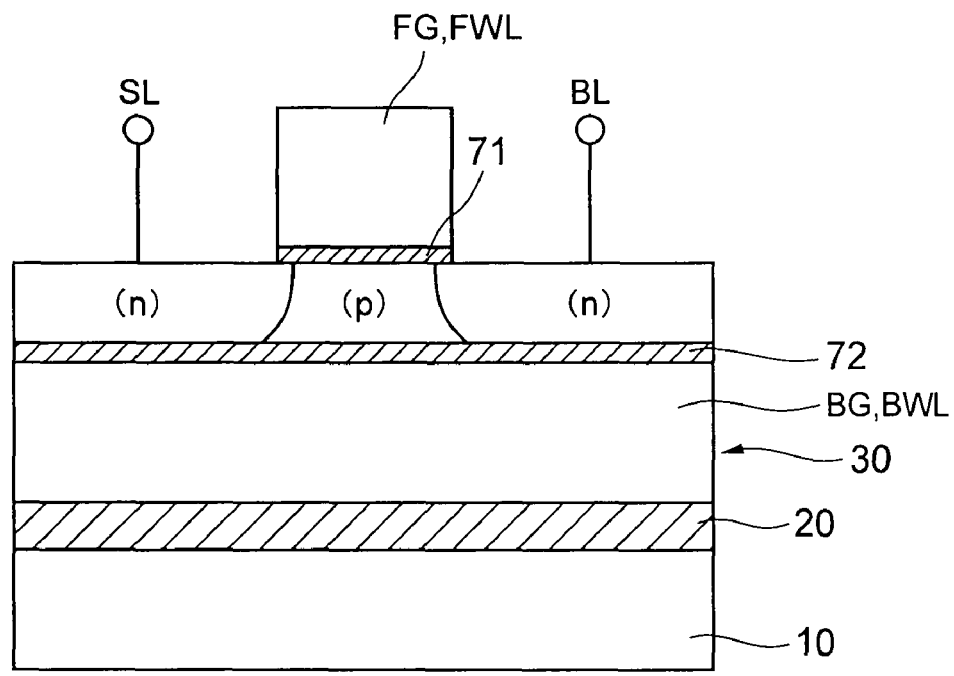
FIG. 7 is a cross-sectional view of each of the memory cells MCs according to the second embodiment.

FIG. 7 is a cross-sectional view of each of the memory cells MCs according to the second embodiment. The back word line BWL shown in FIG. 2 is provided in each row to correspond to each front word line FWL. However, in the second embodiment, one back word line BWL is provided to be common to the entire memory cell arrays MCAL and MCAR. Other configurations of the memory cell MC can be similar to those according to the first embodiment.

Figure 8:
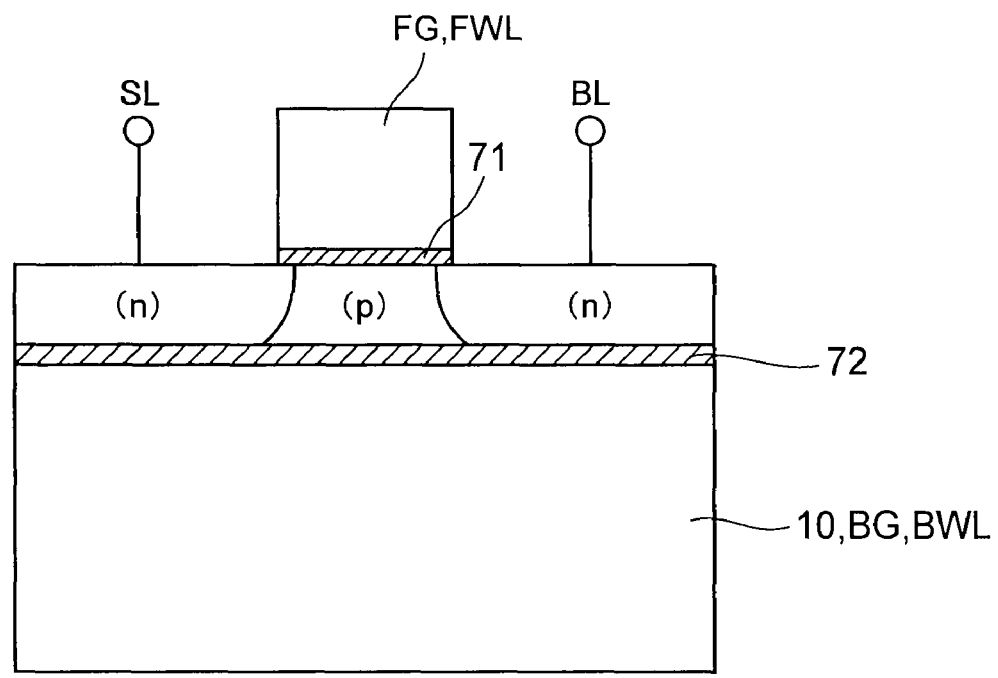
FIG. 8 is a cross-sectional view of another memory cell MC according to the second embodiment.

FIG. 8 is a cross-sectional view of another memory cell MC according to the second embodiment. The memory cell MC shown in FIG. 8 differs from that shown in FIG. 7 in that the silicon substrate 10 also acts as the back word line BWL. Other configurations of the memory cell MC shown in FIG. 8 can be similar to those shown in FIG. 7. A resistance of the back word line WL in the silicon substrate 10 can be reduced by introducing impurity atoms into neighborhoods of an interface between the silicon substrate 10 and a buried insulation film 12 if it is necessary to do so.

The back word line BWL can be provided for every partial block in the memory cell arrays MCAL and MCAR. By doing so, the configuration of the BWL controller can be simplified and the memory cell arrays MCAL and MCAR can be partially autonomously refreshed.

Third Embodiment

Figure 9:
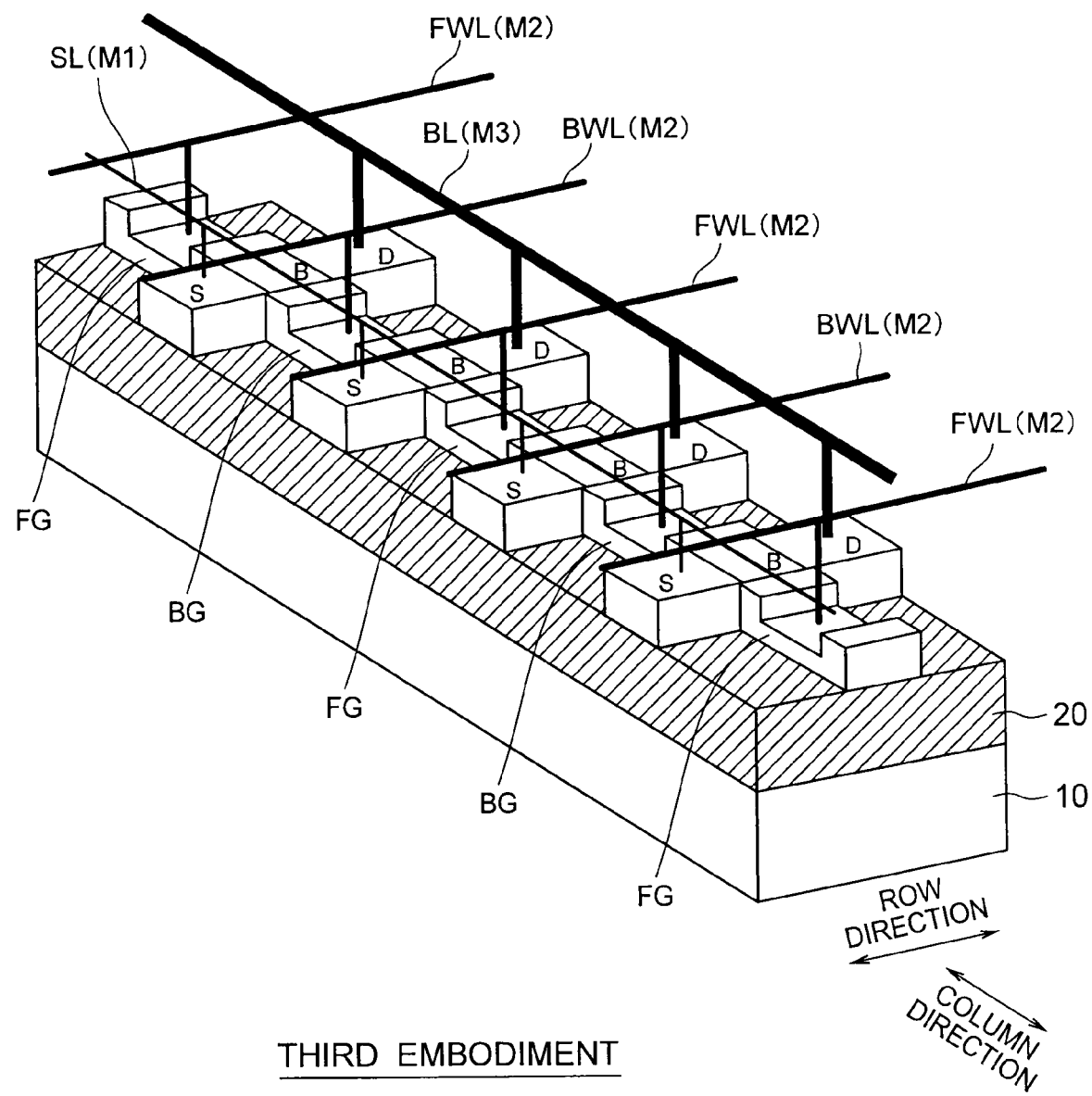
FIGS. 9 and 10 are schematic diagrams showing a configuration of an FBC memory device according to a third embodiment of the present invention.
Figure 10:
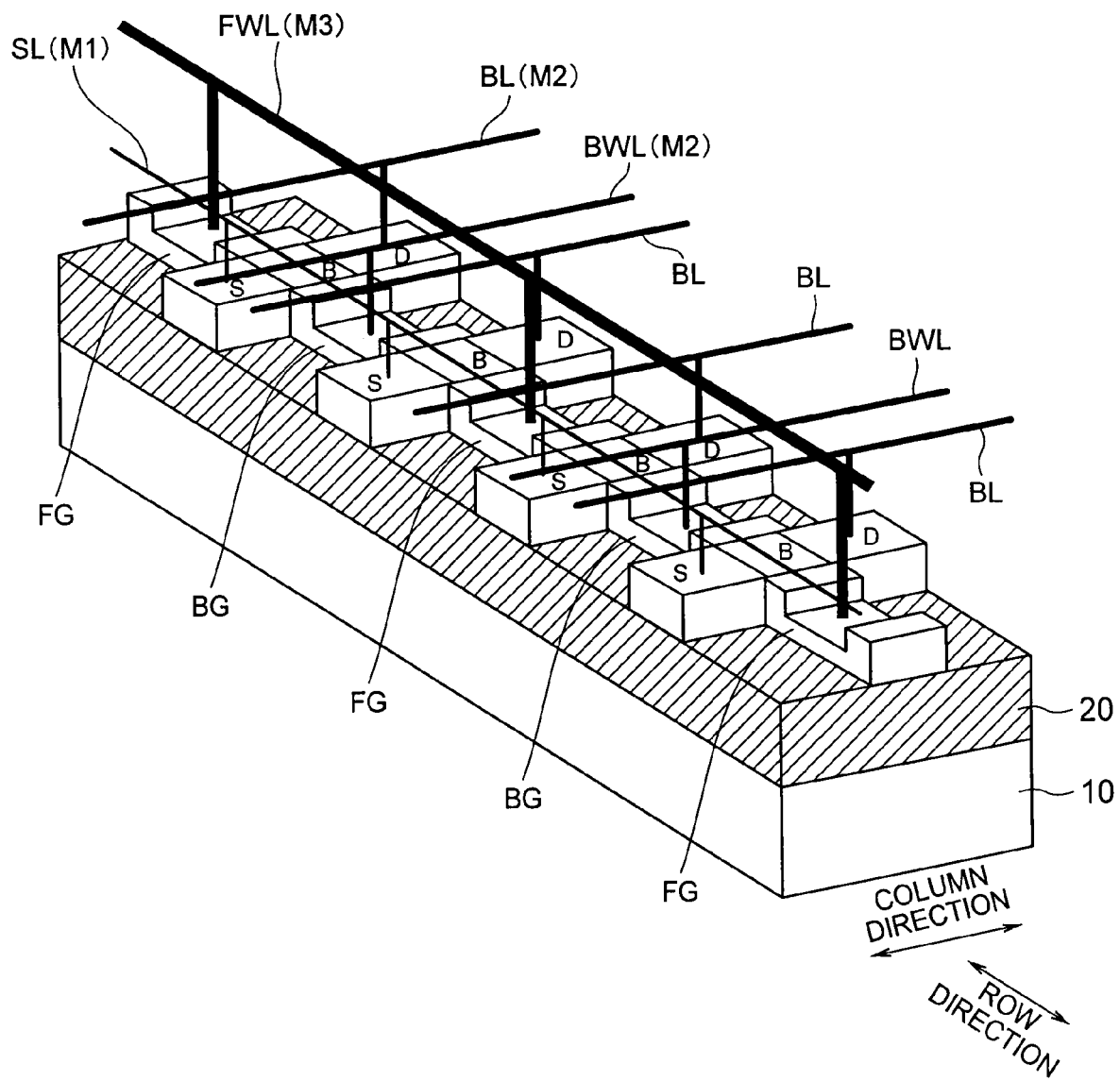

FIGS. 9 and 10 are schematic diagrams showing a configuration of an FBC memory device according to a third embodiment of the present invention. In the third embodiment, Fin-FETs are used as memory cells MCs. In the first and second embodiments, the memory cells MCs are planar FETs and each front word line FWL and each back word line BWL face the upper and lower surfaces of the body 50 of each memory cell MC, respectively. In the third embodiment, by contrast, each front word line FWL and each back word line BWL face side surfaces of the body 50 of each memory cell MC, respectively. Accordingly, the first gate dielectric film and the second gate dielectric film (not shown) are provided between the front word line FWL and the body 50 and between the back word line BWL and the body 50.

In the FBC memory device shown in FIG. 9, source lines SLs and bit lines BLs extend in the same direction (column direction) and front word lines FWLs and back word lines BWLs extend in the row direction orthogonal to the column direction. Each of the source lines SLs is formed out of a first metal layer (lower layer metal) M1. Each of the front word lines FWLs and the back word lines BWLs is formed out of a second metal layer (an intermediate metal layer) M2. Each of the bit lines BLs is formed out of a third metal layer (an upper layer metal) M3. The source lines SLs, the front word lines FWLs, the back word lines BWLs, and the bit lines BLs are made of metal, for example, copper, aluminum or tungsten.

In the FBC memory device shown in FIG. 10, the source lines SLs and the front word lines FWLs extend in the same direction (row direction) and the bit lines BLs and the back word lines BWLs extend in the column direction orthogonal to the row direction. Each of the source lines SLs is formed out of the first metal layer (lower layer metal) M1. Each of the bit lines BLs and the back word lines BWLs is formed out of the second metal layer (intermediate metal layer) M2. Each of the front word lines FWLs is formed out of the third metal layer (upper layer metal) M3.

Other configurations and operations of the FBC memory device according to the third embodiment can be similar to those of the FBC memory device according to the first embodiment. The autonomous refresh operation can be performed on the FBC memory device using Fin-FETs are the memory cells MCs. Therefore, the third embodiment can exhibit the same advantages as those of the first embodiment.

In such a Fin-FBC, it is preferable that the second gate dielectric film is almost equal to the first gate dielectric film. This is because the first and second gate dielectric films can be formed simultaneously to advantageously facilitate manufacturing the FBC memory device.

Fourth Embodiment

Figure 11:
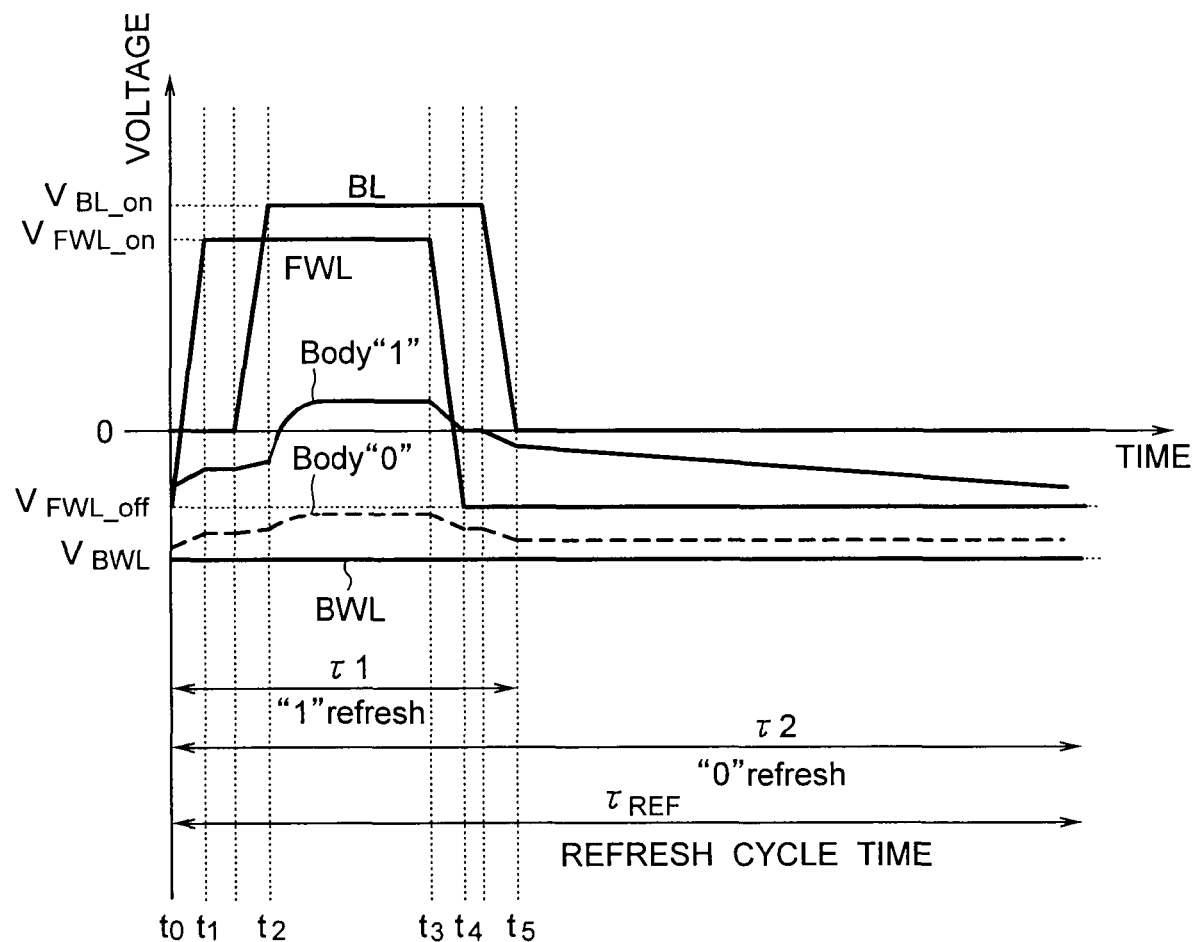
FIG. 11 is a timing diagram showing an operation performed by an FBC memory device according to a fourth embodiment of the present invention.

FIG. 11 is a timing diagram showing an operation performed by an FBC memory device according to a fourth embodiment of the present invention. The FBC memory device according to the fourth embodiment can be similar in configuration to any one of the FBC memory devices according to the first to third embodiments.

In the fourth embodiment, the potential VBWL of each back word line BWL is fixed to a constant negative potential. The tunnel current Idt thereby always flows from the body 50 to the back word line BWL. It can be, therefore, said that the refresh operation on the "0" cells is always performed. For example, if the same structure as that of the memory cell MC according to the first embodiment is adopted as a structure of each memory cell MC according to the fourth embodiment, it is preferable to set the potential VBWL to be lower (shallower) in absolute value than the VBWL_ref shown in FIG. 4 and higher in absolute value than the VBWL_hold shown in FIG. 4. Accordingly, the tunnel current Idt flows out of the body 50 little by little continuously (constantly). A total amount of the tunnel current Idt in one cycle according to the fourth embodiment can be set equal to that according to the first embodiment. By doing so, the relationship between the body current and the body potential according to the fourth embodiment can be set similar to that shown in FIG. 5.

Operations of the bit lines BLs and the front word lines FWLs are similar to those according to the first embodiment.

Therefore, the impact ionization current intermittently flows to the body 50 similarly to the first embodiment. That is, the refresh operation on the "1" cells according to the fourth embodiment is similar to that according to the first embodiment. For example, if the same structure as that of the memory cell MC according to the first embodiment is adopted as the structure of each memory cell MC according to the fourth embodiment, VFWL_off and VFWL_on shown in FIG. 11 can be set equal to the VFWL_hold and VFWL_ref shown in FIG. 4 and VBL_on shown in FIG. 11 can be set equal to the VBL_ref shown in FIG. 4.

As described above, in the fourth embodiment, "0" cell refreshing is always performed and "1" cell refreshing is periodically performed. In the refresh interval τ1 for recovering the "1" cells, the potential of each back word line BWL is fixed to a potential (negative potential) opposite in polarity to the potential VFWL_on of each front word line FWL with a source potential VSL (e.g., ground potential) set as a reference potential. Even if the potential of the back word line BWL is fixed, the relationship between the body current and the body potential shown in FIG. 5 can be obtained in the fourth embodiment. The FBC memory device according to the fourth embodiment can, therefore, perform the autonomous refresh operation similarly to the first embodiment. Furthermore, according to the fourth embodiment, the potential of each back word line BWL is constant, so that a change in the body potential between the data holding interval τ2 and the refresh interval τ1 is smaller than that according to the first embodiment.

Figure 12:
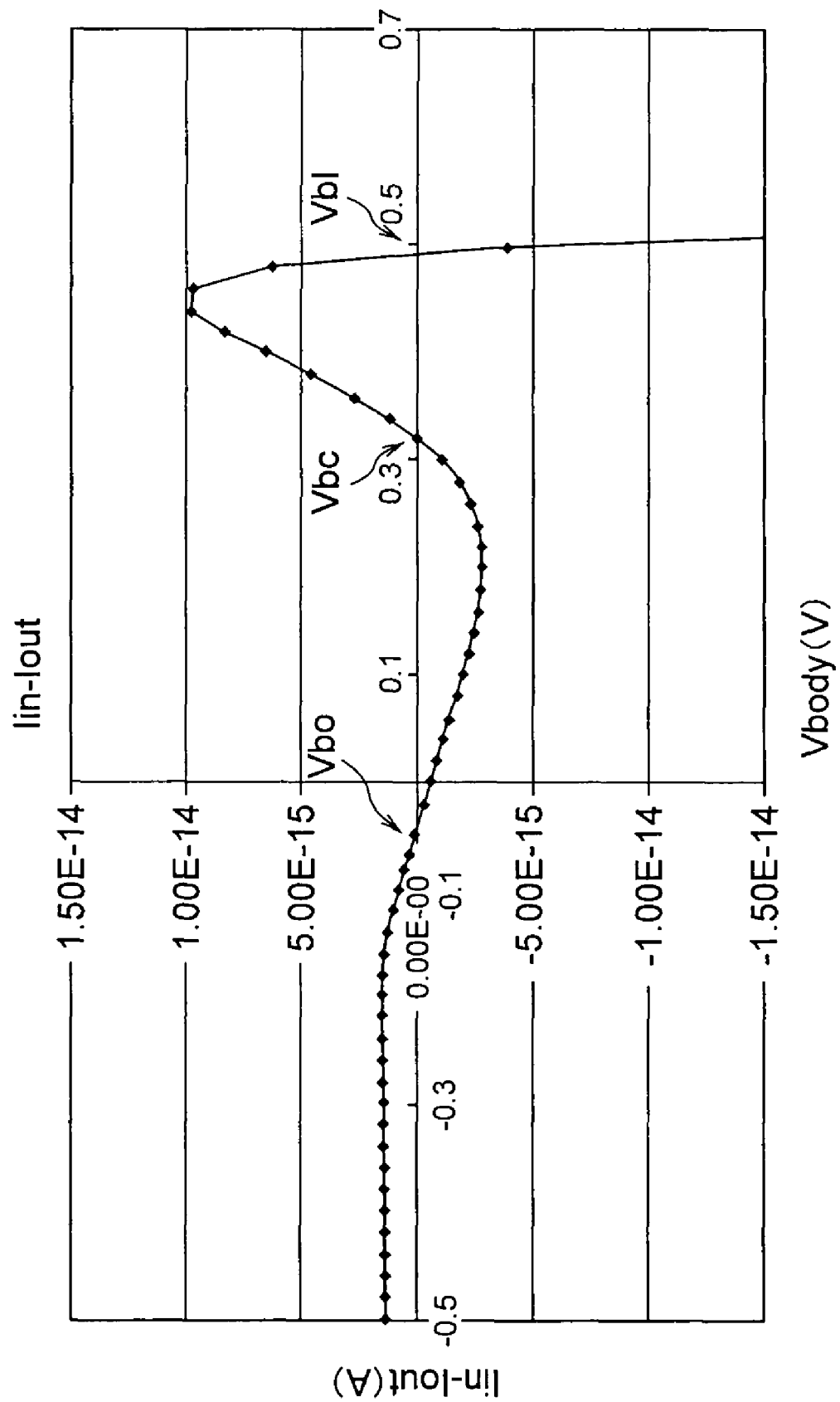
FIG. 12 shows a result of a simulation showing the relationship between the body current and the body potential of the FBC memory device according to the fourth embodiment.

FIG. 12 shows a result of a simulation showing the relationship between the body current and the body potential of the FBC memory device according to the fourth embodiment. Each of the memory cells MCs used in this simulation is configured as follows. A gate length is 75 nm, a gate width is 70 nm, a thickness of a front gate dielectric film is 2.2 nm, a thickness of the body 50 (distance from the front gate dielectric film to a back gate dielectric film) is 21 nm, and a thickness of the back gate dielectric film is 2.2 nm. Further, the potential VBWL of the back word line BWL is −1.4 V, the voltage VFWL_on of the front word line FWL during the "1" cell refreshing is 0.1 V, and the voltage VFWL_off of the front word line FWL during intervals other than the "1" cell refreshing is −1.4 V. The voltage VBL_on of the bit line BL during the "1" cell refreshing is 1.5 V, and the voltage VBL_off of the bit line BWL during intervals other than the "1" cell refreshing is 0 V. Furthermore, the "1" cell refresh interval τ1 is 10 ns and an interval τref of one cycle of the refresh operation is 100 μs. At this time, as shown in FIG. 12, the body current <(Iin−Iout)$_{NET}$> has two stable stationary points Vb0 and Vb1 present on both sides of one unstable stationary point Vbc.

Fifth Embodiment

In the above embodiments, the autonomous refreshing is executed by periodically repeating the two states. For example, in the first embodiment the data holding state and the autonomous refresh operation are repeatedly executed. In the fourth embodiment, the "0" cell refreshing is always executed and the "1" cell refreshing is repeatedly executed. However, the autonomous refreshing can be executed by periodically repeating three or more states. That is, in the interval of one cycle, a plurality of refresh operations can be repeatedly performed. Further, in each refresh operation, a node potential of each of the word lines BWLs and FWLs and the bit lines BLs can be changed. This is because it suffices that the difference <(Iin−Iout)$_{NET}$> between the total current flowing into the body 50 and the total current flowing out of the body 50 during the interval of one cycle has the relationship shown in FIG. 5.

If n states are repeated in one cycle, the body current is represented by the following Equation (4). Each state will be referred to as "node potential state" hereinafter.

$$<(I\text{ in}-I\text{ out})_{NET}> = \sum_{i=1}^{n} <(I\text{ in}-I\text{ out})^{(i)}_{NET}> \quad (4)$$

$$<(I\text{ in}-I\text{ out})^{(i)}_{NET}> = \frac{\left[\sum_{j=1}^{m} Ibody^{(i,j)}(Vbody+\Delta Vbody^{(i)})\right]T^{(i)}}{TREF} \quad (5)$$

In the Equation (5), Ibody$^{(i,j)}$(Vbody+ΔVbody$^{(i)}$) denotes a jth current component flowing as a net current component into the body 50 in a state i (with the polarity of the current flowing into the body 50 and that of the current flowing out of the body 50 set as plus (positive) and minus (negative) polarities, respectively. Ibody$^{(i,j)}$ denotes a function of (Vbody+ΔVbody$^{(i)}$). To correct the shift amount ΔVbody$^{(i)}$ of the potential to follow transition of the node potential state, the ΔVbody$^{(i)}$ is added to the body potential Vbody. The ΔVbody$^{(i)}$ is the shift amount from Vbody$^{(0)}$ to Vbody$^{(i)}$ in each node potential state with the Vbody$^{(0)}$ set as a reference potential (see the following Equation (6)). Note that the potential Vbody$^{(0)}$ can be equal to one of Vbody$^{(i)}$.

$$\Delta Vbody^{(i)} = Vbody^{(i)} - Vbody^{(0)} \quad (6)$$

$$TREF = \sum_{i=1}^{n} T^{(i)} \quad (7)$$

(Autonomous Refresh Operation in Active Mode)

In an active mode other than the data holding mode, to read data to the outside or to write data from the outside, it is necessary to irregularly access the memory cells MCs. However, in the data read/write operation, each sense amplifier S/A performs the conventional refresh operation for temporarily reading the data of the memory cells MCs and writing back the data to the memory cells MCs. Therefore, right after the data read/write operation, each memory cell MC returns to the stable stationary point Vb0 or Vb1. Accordingly, even in a state in which the memory cells MCs are frequently accessed, it suffices to execute the autonomous refreshing in the same interval τREF as that of the cycle in the data holding mode.

Originally, the problem of deterioration in the data stored in each memory cell MC occurs if the memory cell MC is not accessed for the data read/write operation for the interval τREF or longer. Accordingly, in a situation of frequently accessing the memory cell MC, the autonomous refreshing functions as that in the data holding mode.

However, if the memory cell MC is accessed for the data read/write operation quite frequently, disturbance to the memory cell MC possibly disturbs the balance between the current components of the body current <(Iin−Iout)$^{(i)}_{NET}$>. In this case, it is effective to change an operating voltage (node potential) in the autonomous refreshing so that the components (e.g., IPN and IGIDL) fluctuate due to the disturbance among the current components can be neglected (can be made relatively low).

Figure 13:
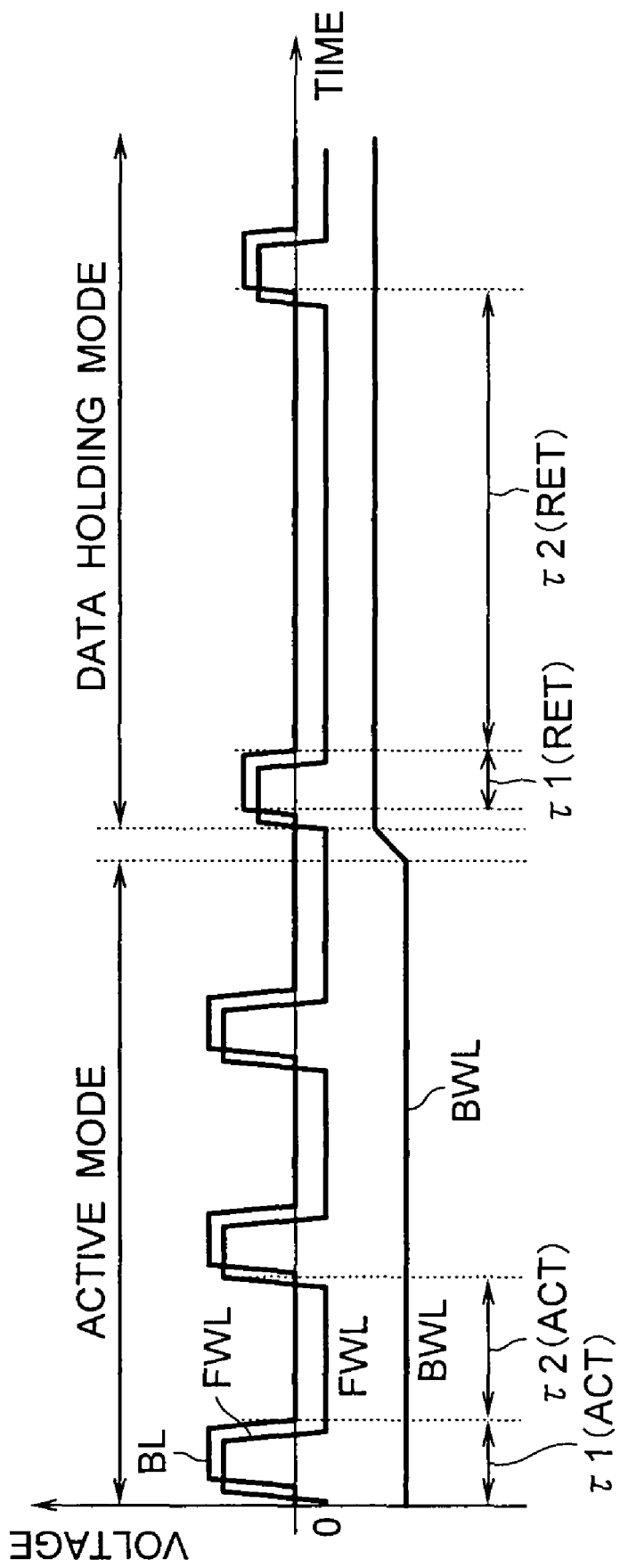
FIG. 13 is a timing chart showing operations of each front word line FWL, each back word line BWL, and each bit line BLW in the active mode and the data holding mode.

FIG. 13 is a timing chart showing operations of each front word line FWL, each back word line BWL, and each bit line BL in the active mode and the data holding mode. For example, as shown in FIG. 13, the back word line potential VBWL in the active mode is set lower (deeper) than that in the data holding mode. That is, the back word line potential VBWL in the active mode is set lower from the source line potential VSL (ground potential) than that in the data holding mode. By so setting, the tunnel current in the active mode is set higher than that in the data holding mode.

Even if the back word line potential VBWL in the data holding mode is set equal to that in the active mode, no problem occurs to the autonomous refreshing function. However, it is necessary to increase the impact ionization current in the data holding mode to balance the increased in the tunnel current. Due to this, DC current carried to each memory cell MC increases, with the result that current reduction effect in the data holding mode is reduced. It is, therefore, preferable that the back word line potential VBWL in the data holding mode is smaller in its absolute value than that in the active mode and it suffices to ensure the autonomous refresh operation.

Moreover, as shown in FIG. 13, the front word line potential VFWL_on and the bit line potential VBL_on in the active mode are set higher than those in the data holding mode, respectively. That is, the front word line potential VFWL_on and the bit line potential VBL_on in the active mode are set higher from the source potential VSL than those in the data holding mode. By so setting, the impact ionization current in the active mode is made higher than that in the data holding mode.

In the active mode, currents serving as non main components other than the tunnel current and the impact ionization current increase as compared with the data holding mode. Due to this, it is also necessary to increase the tunnel current and the impact ionization current as the main components. In this case, the DC current carried to each memory cell MC also increases. However, a high average current originally flows in the active mode. Due to this, increases in the tunnel current and the impact ionization current can be neglected. That is, current consumption hardly increases. Nevertheless, in the data holding mode, it is necessary to realize low data holding current, so that it is not permitted to increase the tunnel current and the impact ionization current. That is, if the tunnel current and the impact ionization current increase, the increase in the current consumption becomes conspicuous. It is, therefore, preferable that the tunnel current and the impact ionization current in the data holding mode are lower than those in the active mode, respectively.

The number of front word lines FWLs, the number of back word lines BWLs, and the number of bit lines BLs activated simultaneously during the autonomous refreshing can be arbitrarily set. For example, similarly to the conventional refresh operation, one front word line FWL, one back word line BWL, and all the bit lines BLs can be activated and all the memory cells MCs connected to the activated word lines FWL and BWL can be simultaneously refreshed. In this case, the current consumption in the data holding mode is similar to the conventional current consumption.

Alternatively, all the word lines FWLs and BWLs and one bit line BL can be activated and all the memory cells MCs connected to the activated bit line BL can be simultaneously refreshed. In this case, the current consumption in the data holding mode depends on the number 2n of word lines FWLs or BWLs, a capacity CWL of the word lines FWLs and BWLs, a BWL driving amplitude $\Delta$VWL, the number 2m of bit lines BLs, a capacity CBL of the bit lines BLs, and a BL driving amplitude $\Delta$VBL. The current consumption in the data holding mode is higher than the conventional current consumption on one occasion and lower than that on another occasion.

In another alternative, all the word lines FWLs and BWLs and all the bit lines BLs can be activated and all the memory cells MCs in each memory cell array MCAL or MCAR can be simultaneously refreshed. In this case, the current consumption in the data holding mode is lower than the conventional current consumption. Furthermore, it is possible to reduce current necessary for peripherals to operate.

Figure 14:
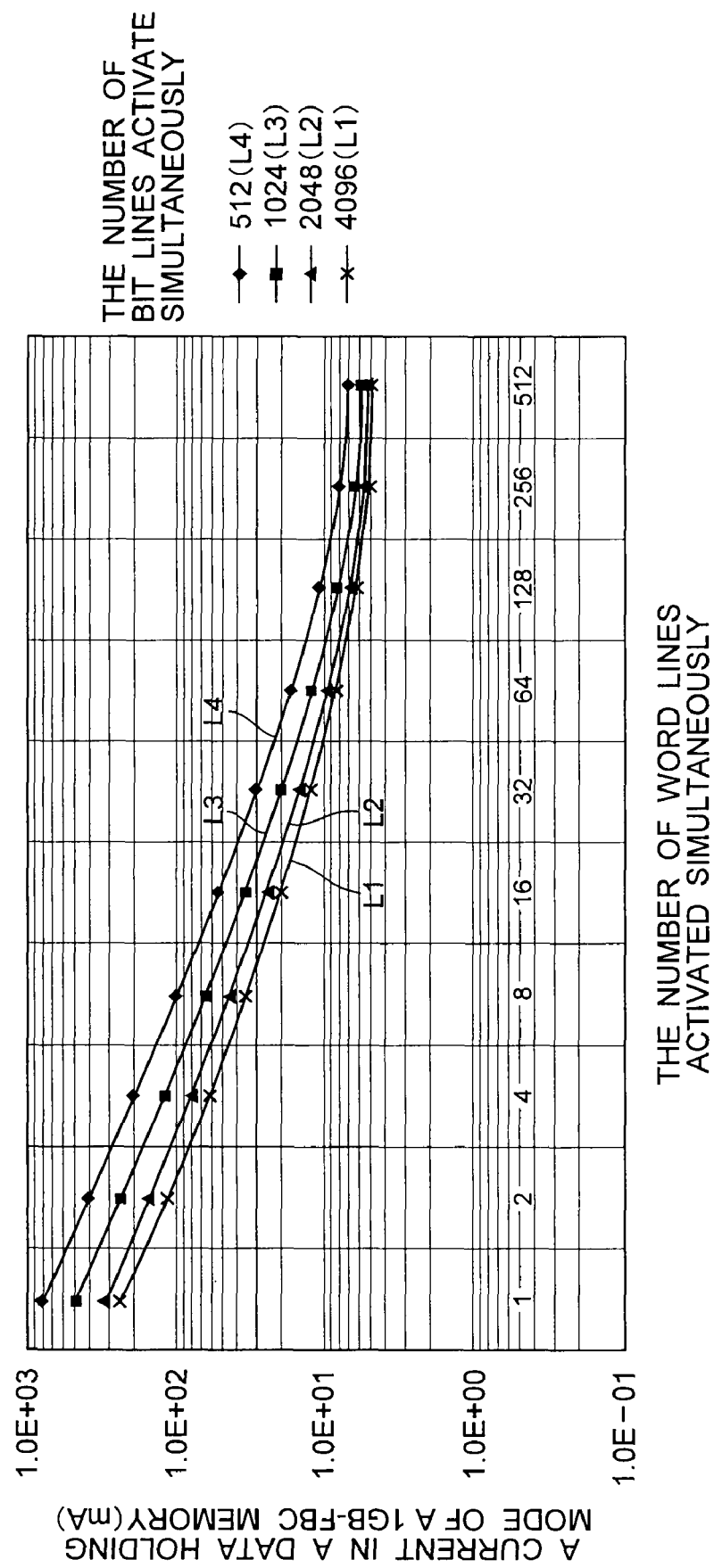
FIG. 14 is a graph showing the relationship between the number of word lines FWLs and BWLs activate simultaneously and the current in the data holding mode.

FIG. 14 is a graph showing the relationship between the number of word lines FWLs and BWLs activated simultaneously and the current in the data holding mode. In FIG. 14, a horizontal axis indicates the number of word lines FWLs activated simultaneously during refreshing and a vertical axis indicates the current flowing into an FBC memory device including 32×12 units (2 Mb×32×16) of 2-Mbit memory cell arrays MCAs in the data holding mode. The current in the data holding mode is current necessary to autonomously refresh a 1-Gbit FBC memory device.

By way of example, it is assumed that the capacity CWL of each front word line FWL is 300 fF, the voltage amplitude $\Delta$VWL of each front word line FWL is 1.5 V, the capacity of each back word line BWL is 100 fF, the voltage amplitude $\Delta$VBL is 1.5 V, a charging capacity CPERI of the peripherals relating to the refresh operation is 200 pF, and a voltage amplitude $\Delta$VPERI of the peripherals is 1.8 V. It is also assumed that the potential of each back word line BWL is constant, retention time TRET of a worst cell is 1 ms, and a refresh cycle time $\tau$ref is 50 ns.

The 16 64-Mbit memory cells MCs are simultaneously refreshed in parallel. In the 64-Mbit memory cells MCs, refresh is executed for two 2-Mbit memory cell arrays MCAs sharing the row decoder therebetween. It is assumed that the DC current flowing into the "1" cells during refreshing is 0.2 $\mu$A and that the time $\tau$1 for refreshing the "1" cells is 20 ns. The influence of the DC current flowing in the memory cells MCs depends on the retention time (e.g., 1 ms) of the memory cells MCs and does not depend on the number of word lines FWLs and BWLs and the number of bit lines BLs activated simultaneously. If half of the memory cells MCs are the "1" cells and half thereof are "0" cells, an average value of the DC current flowing into the 1-Gbit FBC memory device in the data holding time is 4.29 mA.

FIG. 14 is a graph showing the current consumption of the 1-Gbit FBC memory device in the data holding mode relative to the number of word lines FWLs and BWLs activated simultaneously in the 2-Mbit memory array. Curves L1 to L4 show the current consumptions of the 1-Gbit FBC memory device in the data holding mode relative to 512, 1024, 2048, and 4096 bit lines activated simultaneously, respectively.

In the conventional refresh operation, one word line WL is activated and the memory cells MCs connected to 4096 bit lines BLs are activated. In this case, the current in the data holding mode exceeds 200 mA. In the autonomous refresh operation according to the above embodiments, 512 word lines WLs are activated and the memory cells MCs connected to the 4096 bit lines BLs are activated. That is, in the autonomous refresh operation, all the memory cells in the 2-Mbit memory cell array MCA are simultaneously refreshed. In this case, the current in the data holding mode is about 5.0 mA. That is, the current consumption in the data holding mode of the autonomous refresh operation is about ¹⁄₄₀ of that of the conventional refresh operation.

Note that offset current not depending on the number of word lines WLs and the number of bit lines BLs activated simultaneously but depending on integration of the memory cells MCs is present. This offset current results from the DC current flowing into the memory cells MCs. In the fifth embodiment, therefore, the offset current is about 4.29 mA as the DC current flowing into the memory cells MCs corresponding to 1 Gbit. Therefore, to further reduce the current consumption in the data holding mode, it is necessary to reduce the offset current. To reduce the offset current, it suffices to reduce the DC current or shorten the interval τ1 (20 ns in FIG. 14) necessary for refreshing.

Figure 15:
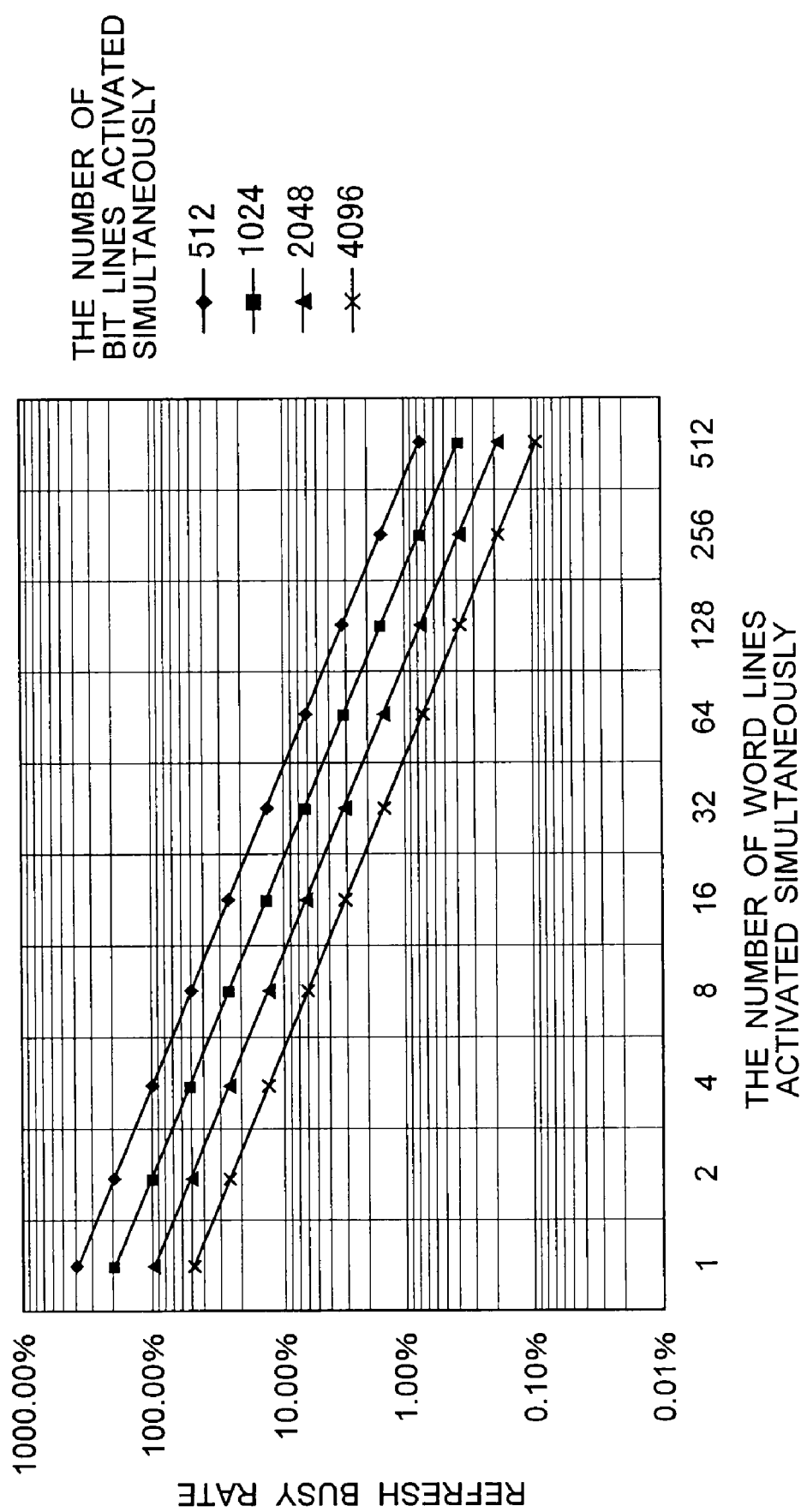
FIG. 15 is a graph showing the relationship between the number of front word lines FWLs activated simultaneously and the refresh busy rate.
Figure 16:
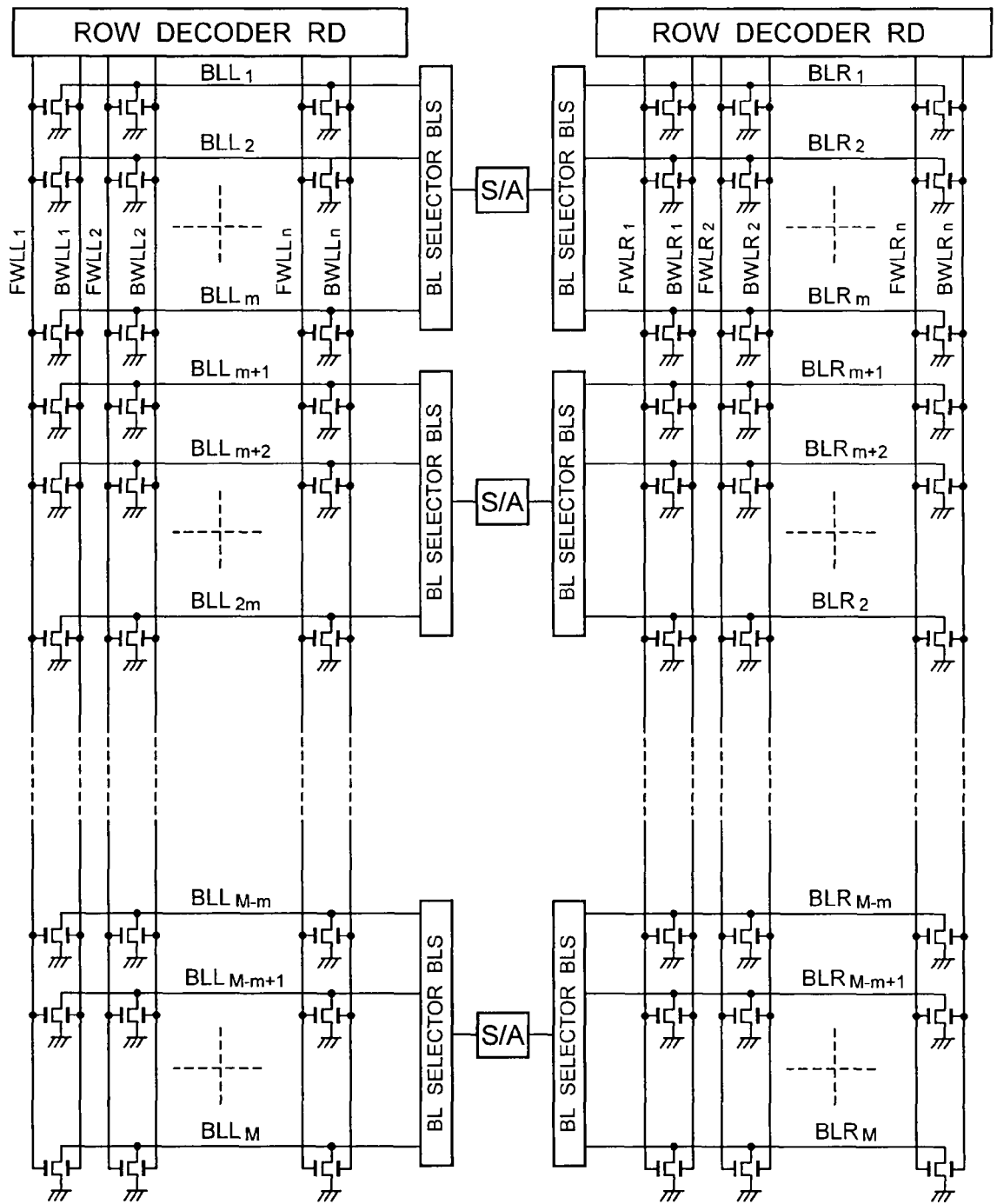
FIG. 16 is a schematic diagram showing an example of a configuration of an FBC memory device according to a sixth embodiment of the present invention.

FIG. 15 is a graph showing the relationship between the number of front word lines FWLs activated simultaneously and the refresh busy rate. In FIG. 15, a horizontal axis indicates the number of front word lines FWLs activates simultaneously during refreshing and a vertical axis indicates the refresh busy rate. The refresh busy rate means a temporal ratio of the autonomous refresh interval τ1 to the interval τref of one cycle in the data holding mode. For example, the refresh busy rate of 100% indicates a state in which the refresh operation needs to be performed always in the data holding mode. As long as the data can be held, lower refresh busy rate is more preferable.

If the number of front word lines FWLs activated simultaneously in the refresh operation is one, the refresh busy rate is about 50% even while the (4096) bit lines BLs in all the columns are simultaneously activated.

In the conventional refresh operation, the number of word lines WLs activated simultaneously should be one. In this case, even if the (4096) bit lines BLs in all the columns are simultaneously activated, the refresh busy rate cannot be made lower than about 50%.

In the autonomous refresh operation according to the fifth embodiment, a plurality of word lines WLs can be simultaneously activated. For example, if the number of front word lines FWLs simultaneously activated in the refresh operation is 512 and the number of bit lines BLs simultaneously activated in the refresh operation is 4096 (if all the memory cells MCs in the memory cell array MCA are refreshed), the refresh busy rate can be reduced to about 0.1%.

Sixth Embodiment

FIG. 16 is a schematic diagram showing an example of a configuration of an FBC memory device according to a sixth embodiment of the present invention. In the sixth embodiment, sense amplifiers S/As are provided at intervals of m bit lines BLs (where m≧2). One bit line selector BLS is provided between one sense amplifier S/A and the m bit lines BLS. The bit line selector BLS is configured to select a specific bit line BL from among the m bit lines BLs and to connect the selected bit line BL to the corresponding sense amplifier S/A in the data read/write operation. In the refresh operation, the bit line selector BLS can select all of the m bit lines BLs to the sense amplifiers, respectively. The FBC memory device according to the sixth embodiment can thereby execute autonomous refresh operation similarly to that according to the first embodiment.

In the sixth embodiment, since the sense amplifiers S/As are provided at intervals of m bit lines BLs, an area of peripherals other than the memory cells MCs can be reduced. That is, a cell occupation ratio to the memory chip improves. The chip size of the FBC memory device can be thereby reduced.

Seventh Embodiment

FIG. 17 is a schematic diagram showing an example of a configuration of an FBC memory device according to a seventh embodiment of the present invention. In FIG. 17, the front word lines FWLs and the back word lines BWLs are shown in a simplified fashion. In the seventh embodiment, the bit lines BLs are classified into local bit lines LBLLk,i and LBLRk,i (where k=1 to N and i=1 to M) (hereinafter, also simply "LBLs") and global bit lines GBLLi and GBLRi (hereinafter, also simply "GBLs"). Some of the memory cells MCs in a certain column are connected to each local bit line LBL. In FIG. 17, (n+1) memory cells MCs are connected to one local bit line LBL. One global bit line GBL is provided to correspond to a plurality of local bit lines LBLs and connected to one sense amplifier S/A.

A bit line switch BSW is connected between one local bit line LBL and the global bit line GBL. The global bit line GBL can be selectively connected to a specific local bit line LBL by the bit line switch BSW.

With a hierarchical bit line configuration shown in FIG. 17, there is no need to provide sense amplifiers S/A to correspond to the local bit lines BLs, respectively and the number of sense amplifier S/As can be decreased. For example, in the specific example shown in FIG. 17, the two global bit lines GBLs are connected to the left and right of each sense amplifier S/A, respectively and each of the global bit lines GBLs is connected to the four local bit lines LBLs (that is, the two global bit lines GBLs are connected to the eight local bit lines LBLs in all). Therefore, the number of bit lines S/As in the seventh embodiment is ⅛ of that in case of providing the sense amplifiers S/As to correspond to the local bit lines LBLs, respectively.

If the conventional refresh operation is executed in such a hierarchical bit line configuration, the number of memory cells MCs that can be refreshed simultaneously is decreased to ⅛. Due to this, the number of refresh cycles (the number of refresh cycles necessary to refresh all the memory cells MCs) increases to raise the refresh busy rate.

Meanwhile, if the autonomous refresh operation according to the seventh embodiment is executed in such a hierarchical bit line configuration, by contrast, the memory cells in the entire memory cell arrays can be refreshed simultaneously irrespectively of the number of sense amplifiers S/As. The autonomous refreshing, therefore, enables all the memory cells to be refreshed without raising the refresh busy rate even in the FBC memory device having the hierarchical bit line configuration. Moreover, by adopting the hierarchical bit line configuration, the number of sense amplifiers S/As can be reduced and the entire size of the FBC memory device can be reduced accordingly.

In the above embodiments, the autonomous refresh operation can be executed even if function (operation) of the front word lines FWLs is replaced by function (operation) of the back word lines BWLs.

In the above embodiments, the memory cells MCs may be P-FETs. In this case, each memory cell MC stores therein data by accumulating electrons or emitting electrons. Furthermore, in this case, the polarity of the potential of each of the front word lines FWLs, the back word lines BWLs, and the bit lines BLs can be inverted.

In the above embodiments, the source potential is set to the ground potential. Alternatively, the source potential can be set to a potential other than the ground potential. In this alternative, the polarity of the potential of each of the front word lines FWLs, the back word lines BWLs, and the bit lines BLs is determined with the source potential set as the reference potential.

The invention claimed is:

1. A semiconductor memory device comprising:
a semiconductor layer;

a source layer and a drain layer provided in the semiconductor layer;

a body region provided on the semiconductor layer between the source layer and the drain layer, and accumulating electric charges or emitting the electric charges to store logic data;

a first gate dielectric film provided on a first surface of the body region;

a first gate electrode provide on the first surface of the body region via the first gate dielectric film;

a second gate dielectric film provided on a second surface of the body region, the second surface different from the first surface;

a second gate electrode provide on the second surface of the body region via the second gate dielectric film;

a driver driving the first gate electrode or the second gate electrode; and a sense amplifier sensing the logic data from a memory cell including the source layer, the drain layer, and the body region, wherein when a refresh operation for returning deteriorated logic data of the memory cell to original logic data is periodically executed, a first current is carried from the drain layer or the source layer to the body region and a second current is carried from the body region to the second gate electrode by respectively applying a first voltage and a second voltage to the first gate electrode and the second gate electrode, the first voltage and the second voltage being opposite in polarity to each other with respect to a potential of the source layer set as a reference potential, and a state of the memory cell is recovered to a stable stationary state in which an amount of the electric charges based on the first current flowing in one cycle of the refresh operation is almost equal to an amount of the electric charges based on the second current flowing in one cycle of the refresh operation.

2. The semiconductor memory device according to claim 1, wherein the amount of the electric charges based on the first current and the amount of the electric charges based on the second current balance to generate two stable stationary points and one unstable stationary point, potentials of the body region corresponding to the two stable stationary points are present on both sides of a potential of the body region corresponding to the one unstable stationary point, and one of the two stable stationary points corresponds to the stationary state of the memory cell storing data "0" and other of the two stable stationary points corresponds to the stationary state of the memory cell storing data "1".

3. The semiconductor memory device according to claim 2, wherein in the refresh operation, a potential equal in polarity to the first gate electrode with respect to the potential of the source layer set as the reference potential is applied to the drain layer.

4. The semiconductor memory device according to claim 1, wherein in the refresh operation, a potential equal in polarity to the first gate electrode with respect to the potential of the source layer set as the reference potential is applied to the drain layer.

5. The semiconductor memory device according to claim 1, wherein when the refresh operation is executed, an impact ionization current is carried from the drain layer or the source layer to the body region and a tunnel current is carried from the body region to the second gate electrode by respectively applying the first and the second voltages to the first gate electrode and the second gate electrode.

6. The semiconductor memory device according to claim 5, wherein the first current and the second current in the refresh operation during an active mode, in which an operation for writing data from an outside or reading the data to the outside is executed, are respectively higher than the first current and the second current in the refresh operation during a data holding mode, in which the write and the read operations are not executed.

7. The semiconductor memory device according to claim 1, wherein the first current and the second current in the refresh operation during an active mode, in which an operation for writing data from an outside or reading the data to the outside is executed, are respectively higher than the first current and the second current in the refresh operation during a data holding mode, in which the write and the read operations are not executed.

8. The semiconductor memory device according to claim 1, further comprising a bit line connected to the drain layer, wherein the refresh operation is executed simultaneously on a plurality of memory cells connected to the same bit line.

9. The semiconductor memory device according to claim 1, further comprising:

a local bit line connected to a drain of the memory cell;

a global bit line provided to correspond to a plurality of local bit lines and connected to the sense amplifier; and a switching element provided between each of the local bit lines and the global bit line.

10. The semiconductor memory device according to claim 1, wherein the first gate dielectric film and the first gate electrode face one of side surfaces of the body region, the second gate dielectric film and the second gate electrode face other of the side surfaces of the body region, and the first gate dielectric film and the second gate dielectric film are equal in thickness.

11. A semiconductor memory device comprising:

a semiconductor layer;

a source layer and a drain layer provided in the semiconductor layer;

a body region provided on the semiconductor layer between the source layer and the drain layer, and accumulating electric charges or emitting the electric charges to store logic data;

a first gate dielectric film provided on a first surface of the body region;

a first gate electrode provide on the first surface of the body region via the first gate dielectric film;

a second gate dielectric film provided on a second surface of the body region, the second surface different from the first surface;

a second gate electrode provide on the second surface of the body region via the second gate dielectric film;

a driver driving the first gate electrode and the second gate electrode; and a sense amplifier sensing the logic data from a memory cell including the source layer, the drain layer, and the body region, wherein a potential of the second gate electrode is fixed to a certain potential so as to constantly carry a tunnel current from the body region to the second gate electrode, and when a refresh operation for returning deteriorated logic data of the memory cell to original logic data is periodically executed, a first current is carried from the drain layer or the source layer to the body region by applying a first voltage to the first gate electrode, the first voltage being opposite in polarity to the potential of the second gate electrode with respect to a potential of the source layer set as a reference potential, and when the refresh operation is periodically executed, a state of the memory cell is recovered to a stationary state in which an amount of the electric charges based on the first current flowing into the body region in one cycle of the refresh operation is almost equal to an amount of the electric charges based on the second current flowing into the second gate electrode from the body region in one cycle of the refresh operation.

12. The semiconductor memory device according to claim 11, wherein
in the refresh operation, a potential equal in polarity to the first gate electrode with respect to the potential of the source layer set as the reference potential is applied to the drain layer.

13. The semiconductor memory device according to claim 11, wherein
when the refresh operation is executed, an impact ionization current is carried from the drain layer or the source layer to the body region and a tunnel current is carried from the body region to the second gate electrode by respectively applying the first and the second voltages to the first gate electrode and the second gate electrode.

14. The semiconductor memory device according to claim 11, wherein
the first current and the second current in the refresh operation during an active mode, in which an operation for writing data from an outside or reading the data to the outside is executed, are respectively higher than the first current and the second current in the refresh operation during a data holding mode, in which the write and the read operations are not executed.

15. The semiconductor memory device according to claim 11, further comprising a bit line connected to the drain layer, wherein
the refresh operation is executed simultaneously on a plurality of memory cells connected to the same bit line.

16. The semiconductor memory device according to claim 11, further comprising:
a local bit line connected to a drain of the memory cell;
a global bit line provided to correspond to a plurality of local bit lines and connected to the sense amplifier; and
a switching element provided between each of the local bit lines and the global bit line.

* * * * *